(12) United States Patent  (10) Patent No.: US 8,759,946 B2
Tokunaga  (45) Date of Patent: Jun. 24, 2014

(54) SEMICONDUCTOR DEVICE

(75) Inventor: Hajime Tokunaga, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 453 days.

(21) Appl. No.: 11/979,992

(22) Filed: Nov. 13, 2007

(65) Prior Publication Data

US 2008/0116500 A1  May 22, 2008

(30) Foreign Application Priority Data

Nov. 17, 2006  (JP) .................................. 2006-310883

(51) Int. Cl.
*H01L 23/52* (2006.01)

(52) U.S. Cl.
USPC ....................... 257/530; 257/50; 257/E23.147

(58) Field of Classification Search
USPC ............ 257/50, 530, E23.147; 438/131, 467, 438/600; 365/96
See application file for complete search history.

(56) References Cited

U.S. PATENT DOCUMENTS

| | | | | |
|---|---|---|---|---|
| 5,126,290 A | * | 6/1992 | Lowrey et al. ................ | 438/600 |
| 5,136,573 A | * | 8/1992 | Kobayashi .................... | 369/116 |
| 5,206,665 A | | 4/1993 | Kawade et al. | |
| 5,233,206 A | * | 8/1993 | Lee et al. ....................... | 257/50 |
| 5,286,993 A | * | 2/1994 | Lowrey et al. ................ | 257/390 |
| 5,363,329 A | * | 11/1994 | Troyan .......................... | 365/184 |
| 5,389,475 A | | 2/1995 | Yanagisawa et al. | |
| 5,412,245 A | * | 5/1995 | Favreau ......................... | 257/530 |
| 5,494,838 A | * | 2/1996 | Chang et al. .................. | 438/264 |
| 5,576,576 A | * | 11/1996 | Hawley et al. ................ | 257/530 |
| 5,625,219 A | | 4/1997 | Takagi | |
| 5,625,220 A | * | 4/1997 | Liu et al. ....................... | 257/530 |
| 5,663,591 A | * | 9/1997 | Iranmanesh ................... | 257/530 |
| 5,686,328 A | | 11/1997 | Zhang et al. | |
| 5,780,919 A | | 7/1998 | Chua et al. | |
| 5,798,534 A | | 8/1998 | Young | |

(Continued)

FOREIGN PATENT DOCUMENTS

| | | |
|---|---|---|
| EP | 0602836 A | 6/1994 |
| EP | 0680087 A | 11/1995 |

(Continued)

OTHER PUBLICATIONS

Cronquist, et al. "Modifications of COTS FPGA Devices for Space Applications," Actel Corporation, 1998, pp. 1-5.

*Primary Examiner* — Robert Huber
(74) *Attorney, Agent, or Firm* — Eric J. Robinson; Robinson Intellectual Property Law Office, P.C.

(57) ABSTRACT

A semiconductor device which does not reduce writing property of a memory element and a method for manufacturing the same are proposed even in the case of forming a silicon film at a step portion formed by a surface of a substrate and a wiring formed over the substrate. The semiconductor device includes a plurality of the memory elements comprising a first electrode formed over a substrate having an insulating surface, sidewall insulating layer formed on side surface of the first electrode, a silicon film formed to cover the first electrode and the sidewall insulating layer, and a second electrode formed over the silicon film, and at least one of the first electrode and the second electrode is formed with a material being capable of being alloyed with the silicon film.

37 Claims, 12 Drawing Sheets

(56) References Cited

U.S. PATENT DOCUMENTS

| | | | |
|---|---|---|---|
| 5,869,843 A * | 2/1999 | Harshfield | 257/5 |
| 5,929,505 A | 7/1999 | Takagi et al. | |
| 6,034,882 A | 3/2000 | Johnson et al. | |
| 6,051,851 A | 4/2000 | Ohmi et al. | |
| 6,111,264 A * | 8/2000 | Wolstenholme et al. | 257/3 |
| 6,288,437 B1 | 9/2001 | Forbes et al. | |
| 6,465,282 B1 | 10/2002 | Többen et al. | |
| 6,525,399 B2 | 2/2003 | Cutter et al. | |
| 6,528,815 B1 | 3/2003 | Brown et al. | |
| 6,563,156 B2 * | 5/2003 | Harshfield | 257/296 |
| 6,566,684 B1 | 5/2003 | Suzawa | |
| 6,750,530 B1 | 6/2004 | Klaasen et al. | |
| 6,795,339 B2 | 9/2004 | Ooishi | |
| 6,809,952 B2 | 10/2004 | Masui | |
| 6,828,685 B2 | 12/2004 | Stasiak | |
| 6,830,952 B2 * | 12/2004 | Lung | 438/95 |
| 6,844,609 B2 | 1/2005 | Motsiff et al. | |
| 6,903,958 B2 | 6/2005 | Bernds et al. | |
| 6,950,331 B2 | 9/2005 | Yang et al. | |
| 6,962,844 B2 | 11/2005 | Stasiak | |
| 6,979,880 B2 | 12/2005 | Bhattacharyya et al. | |
| 7,034,380 B2 | 4/2006 | Andideh | |
| 7,042,001 B2 * | 5/2006 | Kim et al. | 257/3 |
| 7,087,975 B2 | 8/2006 | Lehmann et al. | |
| 7,214,632 B2 * | 5/2007 | Chiang | 438/593 |
| 7,358,590 B2 | 4/2008 | Yukawa et al. | |
| 7,453,082 B2 * | 11/2008 | Reinberg et al. | 257/3 |
| 7,474,375 B2 * | 1/2009 | Kwak et al. | 349/153 |
| 7,658,333 B2 | 2/2010 | Koyama et al. | |
| 7,687,327 B2 | 3/2010 | Cleeves et al. | |
| 8,030,643 B2 | 10/2011 | Asami et al. | |
| 8,193,606 B2 | 6/2012 | Kato et al. | |
| 8,238,152 B2 | 8/2012 | Asami et al. | |
| 8,526,216 B2 | 9/2013 | Asami et al. | |
| 2003/0032210 A1 * | 2/2003 | Takayama et al. | 438/30 |
| 2003/0146452 A1 * | 8/2003 | Chiang | 257/200 |
| 2003/0156449 A1 | 8/2003 | Ooishi | |
| 2003/0183699 A1 | 10/2003 | Masui | |
| 2003/0230746 A1 | 12/2003 | Stasiak | |
| 2004/0026690 A1 | 2/2004 | Bernds et al. | |
| 2004/0027849 A1 | 2/2004 | Yang et al. | |
| 2004/0129960 A1 | 7/2004 | Maruyama et al. | |
| 2004/0142277 A1 * | 7/2004 | Akutsu et al. | 430/270.13 |
| 2004/0164302 A1 | 8/2004 | Arai et al. | |
| 2004/0217441 A1 | 11/2004 | Lehmann et al. | |
| 2005/0006640 A1 | 1/2005 | Jackson et al. | |
| 2005/0174845 A1 | 8/2005 | Koyama et al. | |
| 2006/0097250 A1 | 5/2006 | Koyama et al. | |
| 2006/0134918 A1 * | 6/2006 | Fujii et al. | 438/694 |
| 2006/0175648 A1 | 8/2006 | Asami | |
| 2006/0220252 A1 | 10/2006 | Yukawa et al. | |
| 2006/0263634 A1 | 11/2006 | Yamazaki | |
| 2007/0007342 A1 | 1/2007 | Cleeves et al. | |
| 2007/0258221 A1 | 11/2007 | Koyama et al. | |
| 2008/0083954 A1 | 4/2008 | Tokunaga | |
| 2008/0121859 A1 * | 5/2008 | Campbell | 257/2 |
| 2010/0193789 A1 | 8/2010 | Tokunaga | |
| 2014/0014953 A1 | 1/2014 | Asami et al. | |

FOREIGN PATENT DOCUMENTS

| | | |
|---|---|---|
| JP | 56-044198 | 4/1981 |
| JP | 04-028249 | 1/1992 |
| JP | 04-373147 | 12/1992 |
| JP | 06-216254 A | 8/1994 |
| JP | 07-297293 | 11/1995 |
| JP | 3501416 | 3/2004 |
| JP | 2004-214281 | 7/2004 |
| JP | 2006-270059 A | 10/2006 |
| JP | 2006-310799 A | 11/2006 |
| WO | WO 96/07300 | 3/1996 |
| WO | WO 2004/015778 | 2/2004 |
| WO | WO 2005/096380 | 10/2005 |
| WO | WO 2005/119779 | 12/2005 |

\* cited by examiner

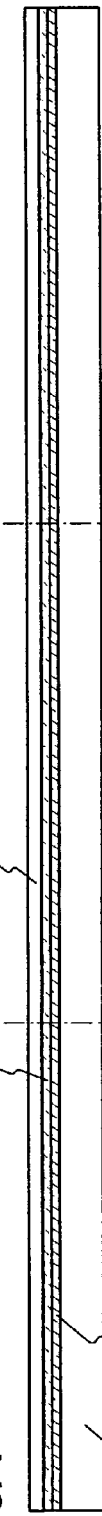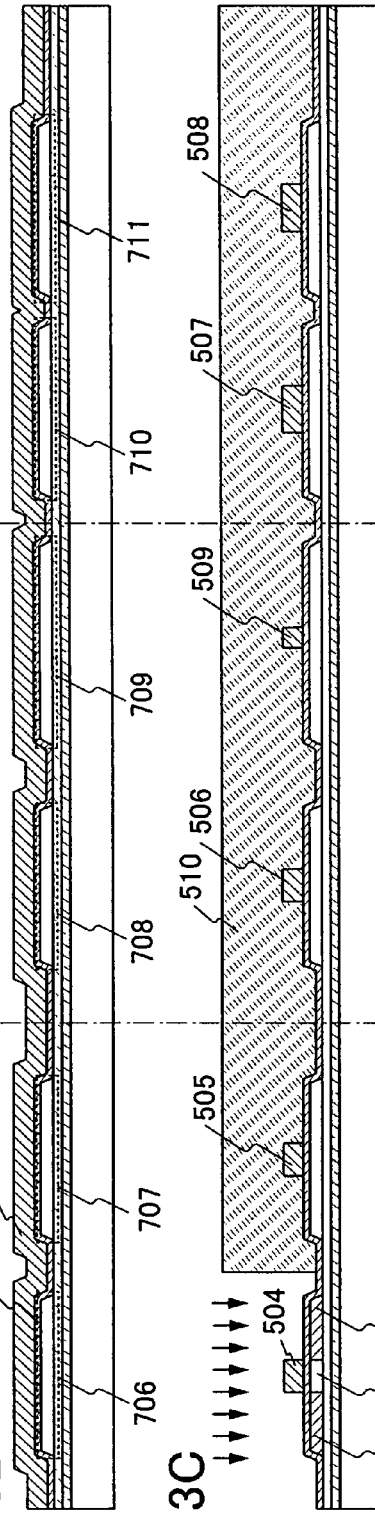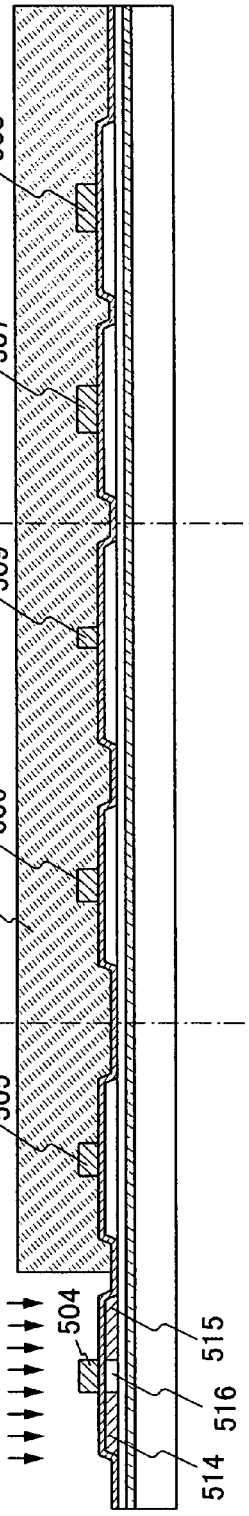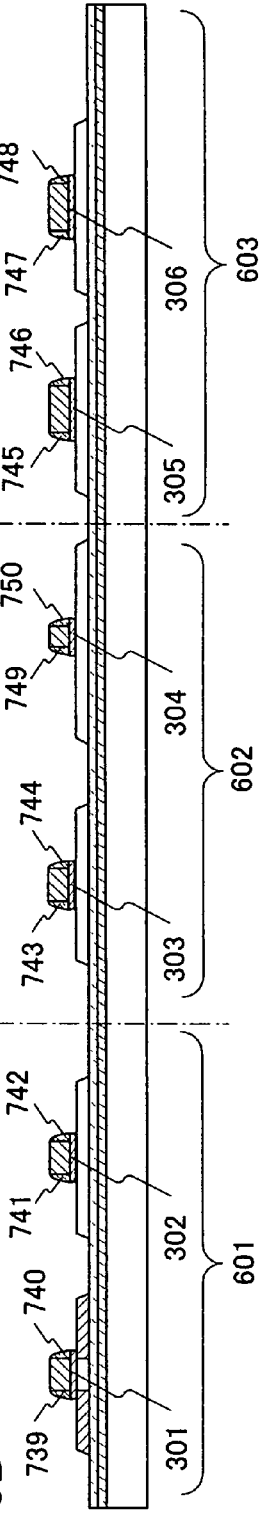

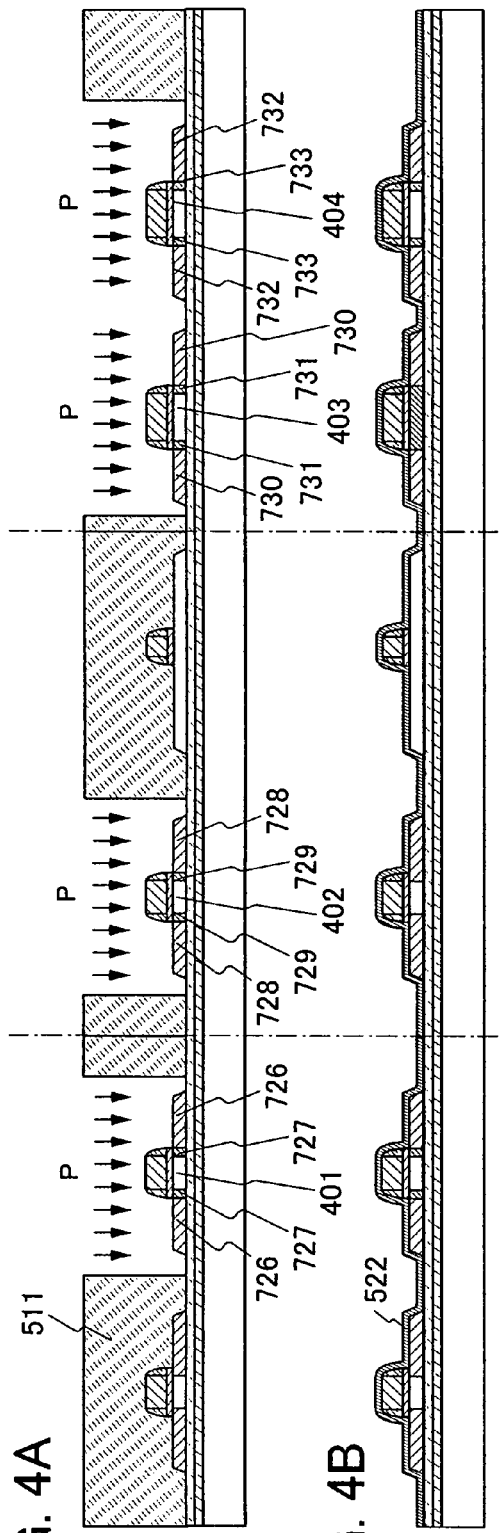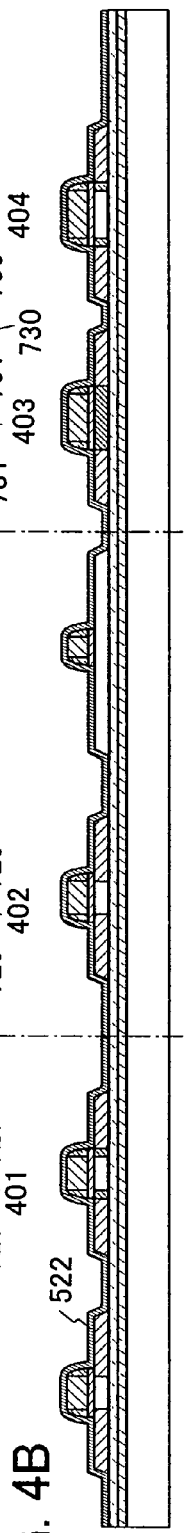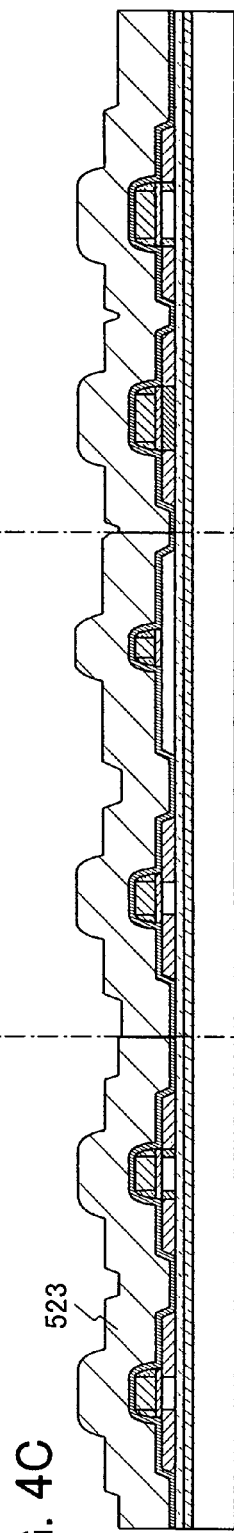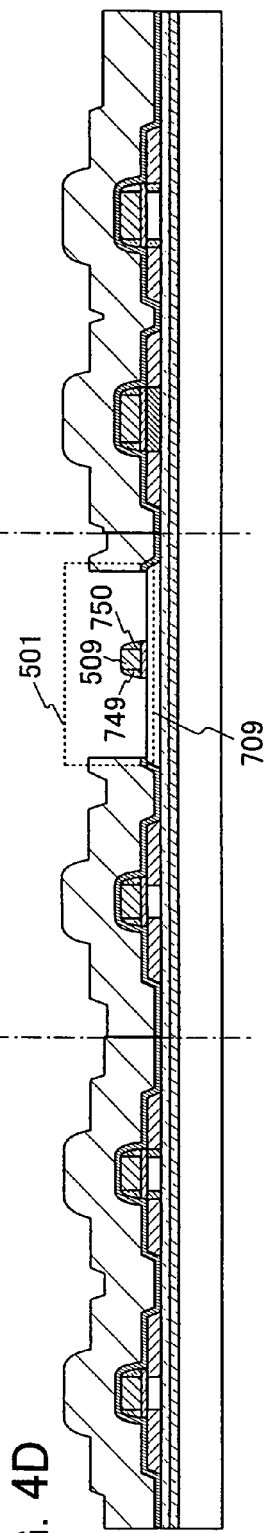

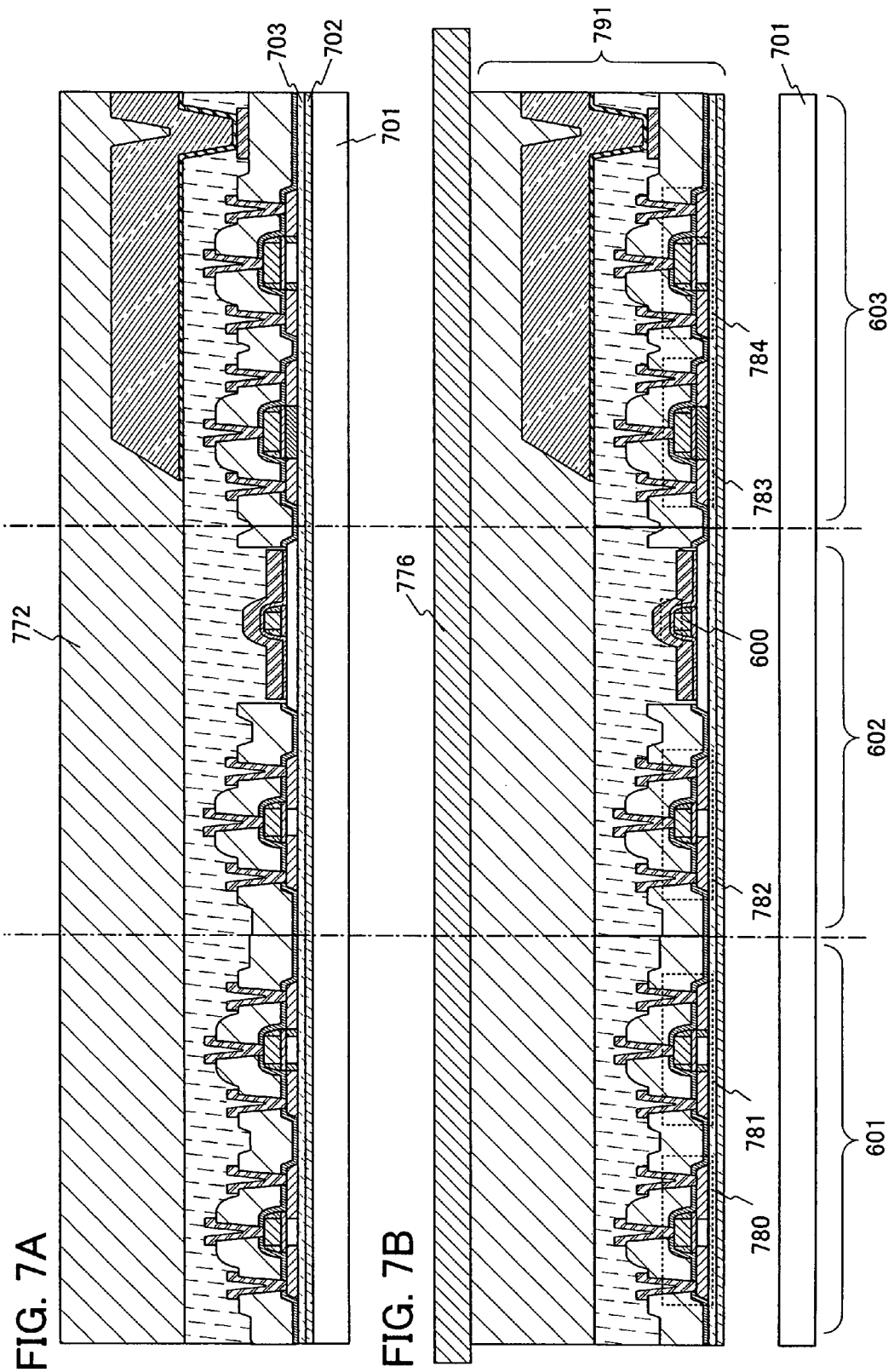

PRIOR ART

SEMICONDUCTOR DEVICE

BACKGROUND OF THE PRESENT INVENTION

1. Field of the Present Invention

The present invention relates to a semiconductor device having a memory element utilizing a silicide reaction and a method for manufacturing the same.

2. Description of the Related Art

Various types of memory have been proposed in the past. As typical memory, memory including an electromagnetic tape or an electromagnetic disk, a RAM capable of writing and reading, a ROM only for reading (read only memory), and the like can be given.

As a conventional ROM, the following can be given: a mask ROM which stores information using a mask in a process for manufacturing an IC, a fuse ROM which stores information by melting down a fuse element with current after manufacturing an IC chip, an antifuse ROM which stores information by short-circuiting an insulator with current after manufacturing an IC chip, and the like.

Since the mask ROM stores information using a mask in a process for manufacturing an IC, a mask corresponding to information to be written has to be prepared, and thus, manufacturing cost has been increased. In addition, the fuse ROM has had a possibility of causing malfunction due to dust generated when a fuse element is melted down.

In addition, the antifuse ROM is more advantageous than other ROM in that the antifuse ROM does not need a mask corresponding to information to be written in manufacturing and dust is not generated when information is written to the memory. In recent years, a technique for forming the antifuse ROM over a silicon substrate by utilizing a silicide reaction has been proposed (for example, Patent Document 1: Japanese Patent No. 3501416).

An anti-fuse ROM disclosed in the Patent Document 1 has a plurality of memory elements including a pair of conductive film serving as a cathode or anode and an amorphous silicon film interposed between the conductive films. The memory elements are elements utilizing variation in resistance of the memory elements in which the conductive films serving as a cathode or anode and the amorphous silicon film take a silicide reaction by application of voltage between the cathode and anode.

The antifuse ROM, for example as shown in FIG. 12A, includes a wiring 1202 functioning as a word line, which is formed over a semiconductor substrate 1201, a amorphous silicon film 1203 formed over the wiring 1202 functioning as a word line, and a wiring 1204 functioning as a bit line, which is formed over the amorphous silicon film 1203. The amorphous silicon film 1203 is sandwiched between the wiring 1202 functioning as a word line and the wiring 1204 functioning as a bit line. In this way, it is effective to form the amorphous silicon film at an intersection of the word and bit lines in miniaturization of the memory elements.

In recent years, a semiconductor device with a wireless communication function, specifically a wireless chip, has been expected to have a large market, thereby having attracted attention. Such a wireless chip is referred to as an ID tag, an IC tag, an IC chip, an RF (radio frequency) tag, a wireless tag, an electronic tag, and an RFID (radio frequency identification) in accordance with usage.

A wireless chip includes an interface, memory, a control portion, and the like. As the memory, RAM capable of writing and reading and a ROM only for reading are used, and they are properly used in accordance with purposes. Specifically, a memory region is assigned for each particular application, and an access right is managed for each application and each directory. In order to manage the access right, the wireless chip has a verification means which compares and verifies a private code of applications and a control unit which gives users the access right of the applications with which the private code is identical, as a result of the comparison and verification by the verification means. Such a wireless chip is formed using a silicon wafer, and integrated circuits such as a memory circuit and an arithmetic circuit are integrated over a semiconductor substrate.

When a card on which such a wireless chip is mounted (a so-called IC card) is compared to a magnetic card, an IC card has advantages of having a large memory capacity, an arithmetic function, high authentication accuracy, and great difficulty in falsification. Therefore, an IC card is suitable for management of personal information. A ROM only for reading is commonly used as memory mounted on an IC card so that falsification is impossible.

SUMMARY OF THE PRESENT INVENTION

However, since the memory elements shown in FIG. 12A has a step on end portions of the semiconductor substrate 1201 and the wiring 1202 functioning as a bit line, a problem that a coating of side surface of the wiring 1202 functioning as a bit line with the amorphous silicon film 1203 or the wiring 1204 functioning as a word line is not sufficient at a step portion like a region 1205 shown in FIG. 12B comes up. Here, FIG. 12B is a schematic diagram of a cross section taken along a dashed-line joining a dot A and a dot B in FIG. 12A.

For example, with insufficient coating of the amorphous silicon film 1203 on a side surface of the wiring 1202 functioning as a bit line, there is the case where the wiring 1202 functioning as a bit line partly touches the wiring 1204 functioning as a word line to cause a short circuit. The amorphous silicon film 1203 is partially thinned on the side surface of the amorphous silicon film 1203 functioning as a bit line and the thickness of the amorphous silicon film 1203 varies, and then leads to a large variation in writing property to the memory elements.

In view of the above problem, a semiconductor device, which does not reduce a writing property of the memory elements, and a method for manufacturing the same are proposed even in the case of forming a silicon film on a step formed by a surface of a substrate and a wiring formed over the substrate.

The present invention relates to a semiconductor device having a plurality of memory elements and a method for manufacturing the same. The semiconductor device includes a first electrode formed over a substrate having an insulating surface, a sidewall insulating layer formed on a side surface of the first electrode, a semiconductor layer formed to cover the first electrode and the sidewall insulting layers, and a second electrode formed over the semiconductor layer. At least one of the first electrode and the second electrode is formed with a material being capable of being alloyed with the semiconductor layer. Note that the semiconductor device may include a transistor besides the memory elements. In the case of using the sidewall insulating layer provided on a side surface of a gate electrode of the transistor, the gate electrode of the transistor and the first electrode of the memory elements are formed in the same step, and the sidewall insulating layer formed on the side surface of the gate electrode and the sidewall insulating layer formed on the side surface of the first electrode can be formed simultaneously.

A semiconductor device of the present invention includes a first electrode formed over a substrate having an insulating surface, a sidewall insulating layer formed on the side surface of the first electrode, a semiconductor layer formed to cover the first electrode and the sidewall insulating layer, and a second electrode formed over the semiconductor layer. At least one of the first electrode and the second electrode is formed with a material being capable of being alloyed with the semiconductor layer.

A semiconductor device of the present invention includes a plurality of thin film transistors and a plurality of memory elements formed over a substrate having an insulating surface. The memory element includes a first electrode formed over the substrate having the insulating surface, a sidewall insulating layer formed on a side surface of the first electrode, a semiconductor layer formed to cover the first electrode and the sidewall insulating layer, and a second electrode formed over the semiconductor layer. The gate electrode of the thin film transistor is formed with the same material as that of the first electrode of the memory element, a source or drain electrode of the each thin film transistor is formed with the same material as that of the second electrode of the memory element. In addition, at least one of the first electrode and the second electrode of the memory element is formed with a material being capable of being alloyed with the semiconductor layer.

A semiconductor device of the present invention includes a plurality of thin film transistors, a plurality of memory elements, and an antenna which are formed over a substrate having an insulating surface. The memory element includes a first electrode formed over the substrate having the insulating surface, the sidewall insulating layer formed on a side surface of the first electrode, a semiconductor layer formed to cover the first electrode and the sidewall insulating layer, and a second electrode formed over the semiconductor layer. Each of the gate electrodes of the thin film transistors are formed with the same material as that of the first electrode of the memory element, the antenna is electrically connected to a connection electrode in a position below the antenna. The connection electrode is electrically connected to the thin film transistor, formed with the same material as that of a source or drain electrode of the thin film transistor, further, is formed with the same material as that of the second electrode of the memory element. Furthermore, at least one of the first electrode and the second electrode of the memory element is formed with the material being capable of being alloyed with the semiconductor layer.

In the semiconductor device of the present invention, the sidewall insulating layer has a curved surface and touches the semiconductor layer at the curved surface. At least one of the first electrode and the second electrode is preferably formed with a material including at least one element selected from Ti, W, Ni, Cr, Mo, Ta, Co, Zr, V, Pd, Hf, Pt, or Fe. Further, the substrate having the insulating surface is preferably a glass substrate, a plastic substrate, a semiconductor substrate, or a sheet of paper. As the semiconductor layer, it is preferably used an amorphous silicon film, a microcrystalline silicon film, or a polycrystalline silicon film.

A method for manufacturing a semiconductor device of the present invention includes the steps of forming a first electrode over a substrate having an insulating surface, forming a sidewall insulating layer on a side surface of the first electrode, forming a semiconductor layer formed to cover the first electrode and the sidewall insulating layer, forming a second electrode over the semiconductor layer. At least one of the first electrode and the second electrode is formed with a material being capable of being alloyed with the semiconductor layer. Note that the sidewall insulating layer preferably has a curved surface and touches the semiconductor layer at the curved surface. As the semiconductor layer, it is preferably used an amorphous silicon film, a microcrystalline silicon film, or a polycrystalline silicon film.

A method for manufacturing a semiconductor device of the present invention relates to the semiconductor device having a plurality of thin film transistors and a plurality of memory elements over one substrate and includes the steps of forming first and second semiconductor layers over a substrate having an insulating surface; forming a first insulating film formed over the first and second semiconductor layers; forming a first electrode over the first semiconductor layer with the first insulating film interposed therebetween; forming a second electrode over the second semiconductor layer with the first insulating film interposed therebetween; forming a sidewall insulating layer on a side surface of the second electrode; forming a second insulating film covering the first electrode, the second electrode, and the sidewall insulating layer; etching the second insulating film to form a first opening which exposes the second electrode, the sidewall insulating layer, and the second semiconductor layer; forming a third semiconductor layer over the second electrode and the sidewall insulating layer; etching the second insulating film to form a second opening which exposes part of the first semiconductor layer; forming a third electrode over the second semiconductor layer; forming a fourth electrode over the first semiconductor layer; and forming at least one of the second electrode and the third electrode with the material being capable of being alloyed with the third semiconductor layer.

It is to be noted that the sidewall insulating layer preferably has a curved surface and touches the third semiconductor layer at the curved surface. As the third semiconductor layer, it is preferably used an amorphous silicon film, a microcrystalline silicon film, or a polycrystalline silicon film. The first and second electrodes are preferably formed in the same step. In addition, the third and fourth electrodes are preferably formed in the same step. A fifth electrode is formed over the second insulating film in the same step of forming the third and fourth electrodes and further, an antenna electrically connected to the fifth electrode is preferably formed over the fifth electrode. The memory element includes the second electrode, the third semiconductor layer, and the third electrode. The thin film transistor includes the first semiconductor layer, the first electrode, and the fourth electrode. Furthermore, the first electrode, the first insulating film, and the fourth electrode serve as the gate electrode, a gate insulating film, and the source or drain electrode of the thin film transistor, respectively.

In the method for manufacturing a semiconductor device of the present invention, the substrate having the insulating surface is preferably a glass substrate, a plastic substrate, a semiconductor substrate, or a sheet of paper.

In the semiconductor device of the present invention, a first electrode does not touch a semiconductor layer on a step portion and only an upper portion of the first electrode functions as a memory element even in the case of forming a semiconductor layer and a second electrode at the step portion formed by a substrate and the first electrode in a memory element portion. The thickness of the semiconductor layer formed over the upper surface of the first electrode is uniform; therefore, variation in writing property of the memory elements can be reduced.

Further, forming a gate electrode of a transistor and the first electrode of the memory element in the same step makes it possible to form a sidewall insulating layer formed on a side surface of the gate electrode and a sidewall insulating layer formed on a side surface of the first electrode simultaneously. Accordingly, a semiconductor device with a stable writing property of the memory element can be easily manufactured without increasing the number of manufacturing steps.

BRIEF DESCRIPTION OF THE DRAWINGS

FIGS. 3A to 3D are views showing an example of steps for manufacturing a semiconductor device with the use of a memory element of the present invention.

FIGS. 4A to 4D are views showing an example of steps for manufacturing a semiconductor device with the use of a memory element of the present invention.

FIGS. 7A and 7B are views showing an example of steps for manufacturing a semiconductor device with the use of a memory element of the present invention.

DETAILED DESCRIPTION OF THE PRESENT INVENTION

Figure 1:
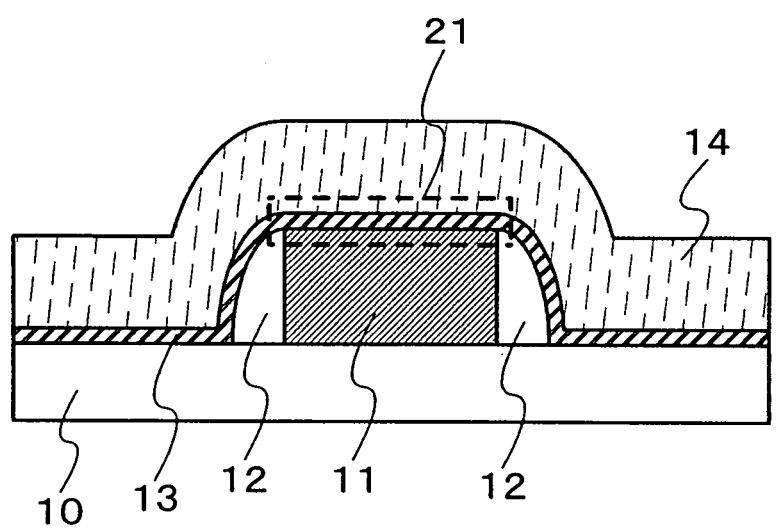
FIG. 1 is a view showing a cross section of a memory element of the present invention.

Embodiment Mode of the present invention will be hereinafter described. However, it is easily understood by those skilled in the art that the present invention is not limited to the following description, and modes and details of the present invention can be modified in various ways without departing from the purpose and the scope of the present invention. Therefore, the present invention should not be interpreted as being limited to the description of Embodiment Mode. Note that reference numerals denoting the same portions are used in common in different drawings in the structure of the present invention hereinafter described.

(Embodiment Mode 1)

In this embodiment mode, a structure of a memory element having an insulating material on a side surface of a conductive layer serving as a cathode or anode will be described.

As shown in FIG. 1, the memory element in this embodiment mode includes a first electrode 11 formed over a substrate 10 which has a insulating surface, a sidewall insulating layer 12 formed on a side surface of the first electrode 11, a silicon film 13 formed to cover the first electrode 11 and the sidewall insulating layer 12, and a second electrode 14 formed over the silicon film 13. Note that a step portion is formed by the substrate 10 and the first electrode 11, and the silicon film 13 and the second electrode 14 are formed to cover the step portion. In addition, the sidewall insulating layer 12 prevents the side surface of the first electrode 11 and the silicon film 13 from directly touching each other. A surface of the sidewall insulating layer 12 touching the silicon film 13 may be curved. When voltage is applied between the first electrode 11 and the second electrode 14, at least one of the first electrode 11 and the second electrode 14 is alloyed with the silicon film 13, and a state of a region 21 is changed, whereby resistivity of the memory element is changed. Accordingly, in a semiconductor device provided with a plurality of the memory elements shown in FIG. 1, forming an alloyed memory element and an unalloyed memory element separately makes it possible to write data into the semiconductor device. Further, reading resistivity of the memory element permits reading data which is written into the semiconductor device.

Here, a method for manufacturing the memory element shown in FIG. 1 is described. First, a titanium (Ti) film is formed over the substrate 10 (for example, a glass substrate) having an insulating surface by a plasma CVD method, a sputtering method, or the like and then the first electrode 11 is formed by etching. Subsequently, an insulating film formed of a silicon film or the like is formed over the substrate 10 having an insulating surface by a thermal CVD method or the like. Then, the insulating film formed of a silicon film or the like is etched to form the sidewall insulating layer 12 with the insulating film formed of a silicon film or the like is partially left on the side surface of the first electrode 11. Next, the silicon film 13 is formed to cover the first electrode 11 and the sidewall insulating layer 12 by a plasma CVD method or the like. After that, the second electrode 14 formed of a titanium film is formed over the silicon film 13 by a plasma CVD method, a sputtering method, or the like. Through the above steps, the memory element shown in FIG. 1 can be manufactured.

Here, a glass substrate, a quartz substrate, or the like can be used for the substrate 10. In addition, for a plastic substrate, polyethylene terephthalate (PET), polyethylene naphthalate (PEN), polyethersulfone (PES), acrylic, or the like can be selected. Moreover, a sheet of paper or the like can be used for the substrate 10.

Further, an amorphous silicon film, a microcrystalline silicon film, or a polycrystalline silicon film can be used for the silicon film 13. A film formed to cover the first electrode 11 and the sidewall insulating layer 12 is not limited to a silicon film, and it may be a semiconductor layer formed of a material being capable of being alloyed with at least either the first electrode 11 or the second electrode 14. For example, a compound semiconductor such as GaAs, InP, SiC, ZnSe, GaN, or SiGe; an oxide semiconductor such as zinc oxide (ZnO) or tin oxide ($SnO_2$), or the like as well as a single semiconductor such as silicon (Si) or germanium (Ge) can be used.

Furthermore, at least either the first electrode 11 or the second electrode 14 is formed using the material being capable of being alloyed with the silicon film 13. For a film using a material being capable of being alloyed with the silicon film, a metal material formed of an element selected from titanium (Ti), tungsten (W), nickel (Ni), chrome (Cr), molybdenum (Mo), tantalum (Ta), cobalt (Co), zirconium (Zr), vanadium (V), palladium (Pd), hafnium (Hf), platinum (Pt), or iron (Fe); a single film of an alloy material or a compound material which contains the element as its main component; or a stacked film of the materials.

Note that in the case of forming one of the first electrode 11 or the second electrode 14 with the material being capable of being alloyed with the silicon film 13, a material for the other electrode is not limited in particular. For example, the other electrode can be formed with an element selected from tantalum (Ta), tungsten (W), titanium (Ti), molybdenum (Mo), aluminum (Al), copper (Cu), or chrome (Cr); or an alloy material or a compound material which contain the element as its main component. Alternatively, the other electrode may be formed with a semiconductor material typified by polycrystalline silicon doped with an impurity element such as phosphorus. When the first electrode 11 or the second electrode 14 is formed of a film in which a conductive material is stacked, a side touching the silicon film 13 may be formed with the material being capable of being alloyed with the silicon film 13. It is to be noted that the semiconductor layer can be formed by a sputtering method, an LPCVD method, or a plasma CVD method, or the like.

The sidewall insulating layer 12 can be formed by etching an insulating film which is a single or stacked layer of film including an inorganic material such as silicon, an oxide of silicon, or nitride of silicon, or an organic material such as an organic resin, formed over the substrate 10 having an insulating surface by a thermal CVD method, a plasma CVD method, a sputtering method, or the like.

Figure 2A:
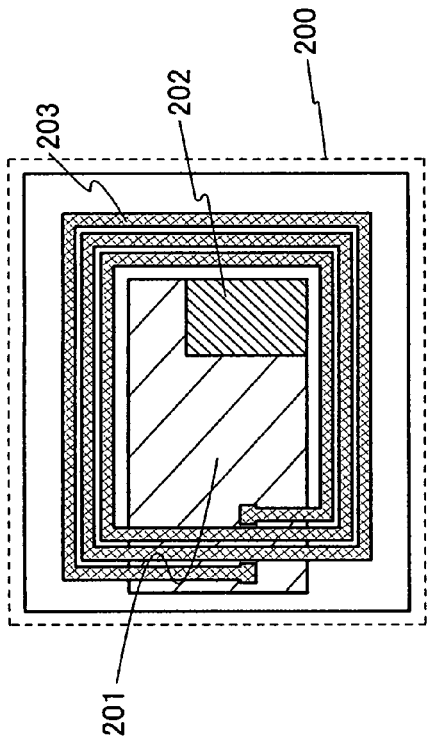
FIGS. 2A and 2B are views showing a structural example of a semiconductor device with the use of a memory element of the present invention.
Figure 2B:
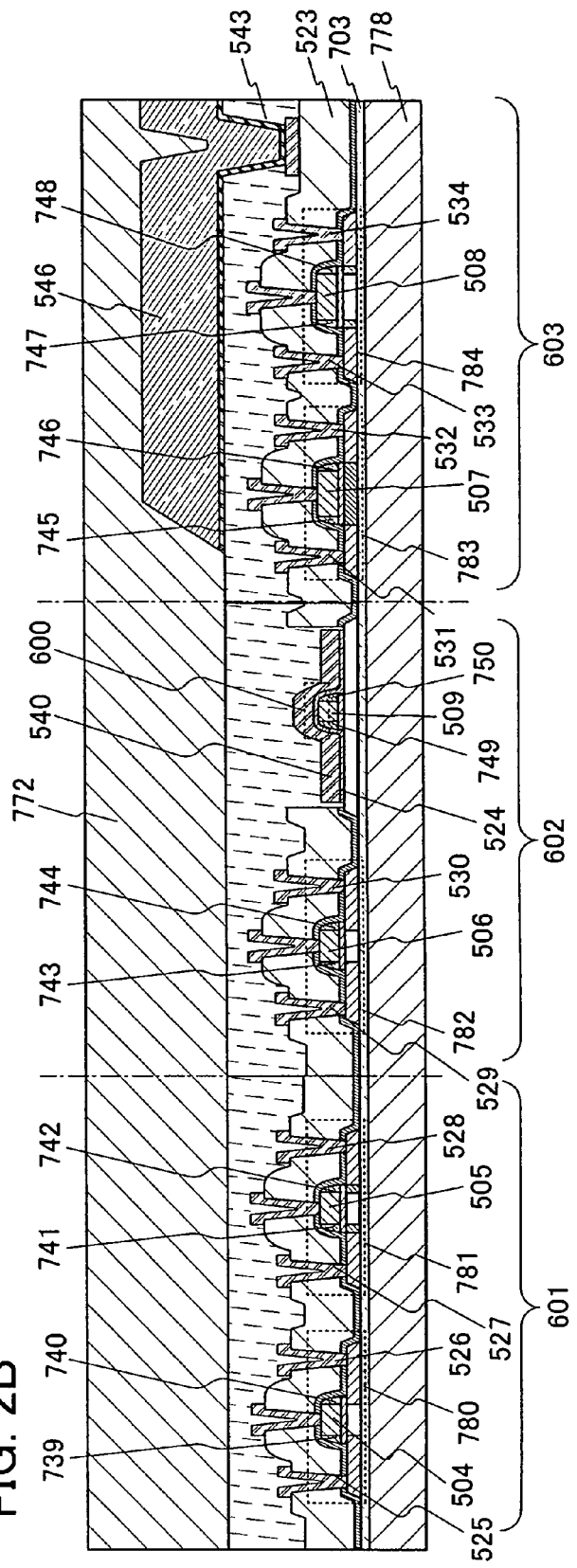

The memory element shown in FIG. 1 can be used for a memory portion of a wireless chip capable of wireless communication with outside, for instance, shown in FIGS. 2A and 2B.

A wireless chip 200 is provided with a driver circuit portion 201, a memory portion 202 including a plurality of the memory elements, and an antenna portion and power supply portion 203 (FIG. 2A). Note that a driver circuit portion 601 in FIG. 2B corresponds to part of a cross sectional structure of the memory portion 201 in FIG. 2A, a memory portion 602 corresponds to part of a cross sectional structure of the memory portion 202 in FIG. 2A, and the antenna portion and the power supply portion 603 corresponds to part of a cross sectional structure of the antenna portion and the power supply portion 203 in FIG. 2A. It is needless to say that the memory portion includes a plurality of the memory elements and the memory portion and the driver circuit portion include a plurality of elements such as thin film transistors (TFTs) and capacitors in FIGS. 2A and 2B.

The wireless chip shown in this embodiment mode is provided with a plurality of memory elements 600 in a memory portion 602 having the following: a first electrode 509 formed over a substrate 778 which has an insulating surface; sidewall insulating layers 749 and 750 formed on side surfaces of the first electrode 509; a silicon film 524 formed over the first electrode 509 and the sidewall insulating layers 749 and 750; and a second electrode 540 formed over the silicon film 524 (FIG. 2B). In addition, the wireless chip includes thin film transistors (TFTs) 780 to 784 provided over the substrate 778 with an insulating layer 703 interposed therebetween, sidewall insulating layers 739 to 748 provided on side surfaces of the thin film transistors (TFTs) 780 to 784, an insulating film 523 provided over the thin film transistors 780 to 784, and source or drain electrodes 525 to 534 provided over the insulating film 523.

In this embodiment mode, gate electrodes 504 to 508 of the thin film transistors (TFTs) 780 to 784 and the first electrode 509 are manufactured in the same step, and the source or drain electrodes 525 to 534 and the second electrode 540 are manufactured in the same step. In other words, the gate electrodes 504 to 508 and the first gate electrode 509 are formed with the same material, and the source or drain electrodes 525 to 534 and the second electrode 540 are formed with the same material. In addition, the sidewall insulating layers 739 to 748 provided on side surfaces of the thin film transistors (TFTs) 780 to 784 and the sidewall insulating layers 749 and 750 formed on the side surfaces of the first electrode 509 are manufactured in the same step.

In this way, forming the gate electrodes of the transistors and the first electrode of the memory element in the same step makes it possible to form the sidewall insulating layer formed on the side surfaces of the gate electrodes and the sidewall insulating layer formed on the side surface of the first electrode simultaneously without increasing the number of manufacturing steps.

The wireless chip shown in this embodiment mode includes an insulating film 543 formed over the source or drain electrodes 525 to 534 and the second electrode 540, an antenna 546 formed over the insulating film 543, and an insulating layer 772 provided to cover the insulating film 543 and the antenna 546. Note that in this embodiment mode at least either the first electrode 509 or the second electrode 540 is formed with a material being capable of being alloyed with the silicon film 524.

Since the memory element shown in this embodiment mode has the sidewall insulating layer provided on the side surface of the first electrode, a structure in which the first electrode and the silicon film do not directly touch each other can be obtained. As a result, even in the case of forming the silicon film and the second electrode over the step portion formed by the substrate and the first electrode, the first electrode and the silicon film do not touch each other in the step portion and only the upper portion of the first electrode functions as the memory element. A film thickness of the silicon film formed over the upper surface of the first electrode is uniform. Therefore, variation in writing property of the memory element can be reduced.

Further, forming the gate electrode of the transistors and the first electrode of the memory element in the same step makes it possible to form the sidewall insulating layer formed on the side surface of the gate electrode and the sidewall insulating layer formed on the side surface of the first electrode simultaneously. Accordingly, a semiconductor device having a stable writing property of the memory element can be manufactured without increasing the number of manufacturing steps. Furthermore, the semiconductor device can be miniaturized because reduction of variation in writing property can be realized even when the memory element is manufactured at an intersection of wirings each functioning as a word and a bit line.

(Embodiment Mode 2)

In this embodiment mode, steps for manufacturing the semiconductor device including the memory elements shown in Embodiment Mode 1 will be described with reference to the drawings. A wireless chip capable of wireless communication with outside as an example of the semiconductor device including the memory elements will be described in this embodiment mode.

First, a separation layer 702 is formed over one surface of a first substrate 701 (FIG. 3A). When the first substrate 701 has an insulating surface, there is no particular limitation on the first substrate 701. For example, a substrate such as a quartz substrate, a glass substrate, or a plastic substrate can be used. If the first substrate 701 is formed of glass, there are no particular limitations on the area and the shape thereof. Thus, for example, when a substrate having one side of one meter or longer and rectangular shape is used for the first substrate 701, the productivity can be drastically improved. Such advantages are superior points to those of circular single crystal silicon substrates. In addition, when the substrate 701 is formed of plastic, a heat resistant plastic which can endure heat treatment temperature the manufacturing process are needed. Although described later, preferably, after a thin film transistor is provided over the first substrate 701 made of glass, the thin film transistor may be separated from the first substrate 701 and provided over a substrate made of plastic.

Note that in this manufacturing process, the separation layer 702 is formed over an entire surface of the first substrate 701; however, as necessary, after the separation layer is provided over an entire surface of the first substrate 701, the separation layer may be etched by a photolithography method to be selectively formed. Alternatively, the separation layer 702 touches the first substrate 701; however, as necessary, an insulating layer serving as a base may be formed to touch the first substrate 701, and the separation layer 702 may be formed to touch the insulating layer.

The separation layer 702 is formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material or a compound material containing such an element as a main component to have a single layer structure or a stacked layer structure by a sputtering method, a plasma CVD method, or the like.

Subsequently, a metal oxide layer may be formed by oxidizing a surface of the separation layer 702. The metal oxide layer may be formed by oxidizing a surface of the separation layer 702 using pure water, ozone water, or oxygen plasma. Alternatively, the metal oxide layer may be formed by heat treatment in an atmosphere containing oxygen, or may be formed in a later step of forming an insulating layer. In this case, when a silicon oxide film or a silicon nitride oxide film is formed as the insulating film by a plasma CVD method, the surface of the separation layer 702 is oxidized so as to form the metal oxide layer.

Next, an insulating layer 703 serving as a base is formed to cover the separation layer 702. As the insulating layer 703, a layer containing an oxide of silicon or a nitride of silicon is formed by a method such as a sputtering method or a plasma CVD method, or the like to have a single layer or a stacked layer. An oxide material of silicon is a substance containing silicon (Si) and oxygen (O) and corresponds to silicon oxide, silicon oxide containing nitrogen, or the like. A nitride material of silicon is a substance containing silicon and nitrogen (N), and corresponds to silicon nitride, silicon nitride containing oxygen, or the like. The insulating layer serving as a base functions as a blocking film for preventing impurities from entering from the first substrate 701. A typical example is two-layer structure; a stack-layered structure in which a silicon nitride oxide film with a thickness of 50 to 100 nm formed of $SiH_4$, $NH_3$, and $N_2O$ as reaction gas by a PCVD method, and a silicon oxynitride film with a thickness of 100 to 150 nm formed of $SiH_4$ and $N_2O$ as reaction gases are stacked. Preferably used a silicon nitride film (a SiN film) with a thickness of lower than or equal to 100 nm, or a silicon nitride oxide film ($SiN_xO_y$ film (X>Y)) as the insulating layer 703. A three-layer structure in which a silicon nitride oxide film, a silicon oxynitride film, and a silicon nitride film are sequentially stacked may be employed. Note that the insulating layer 703 is not necessarily provided, if there is no particular necessity.

Subsequently, an amorphous semiconductor layer 704 is formed over the insulating layer 703. The amorphous semiconductor layer 704 is formed by a sputtering method, an LPCVD method, a plasma CVD method, or the like. With a plasma CVD method, the insulating layer 703 and the amorphous semiconductor layer 704 can be sequentially stacked without exposure to the air. The amorphous semiconductor layer is preferably formed with a thickness of 25 to 80 nm (more preferably 30 to 70 nm). Next, the amorphous semiconductor layer 704 is crystallized by a crystallization method (such as a laser crystallization method, a thermal crystallization method using RTA or an annealing furnace, a thermal crystallization method using a metal element for promoting crystallization, or a combination of a thermal crystallization method using a metal element which promotes crystallization and a laser crystallization method) to form a crystalline semiconductor layer. Afterwards, the obtained crystalline semiconductor layer is etched into a desired shape to form crystalline semiconductor layers 706 to 711 (FIG. 3B).

Here, an example of process for manufacturing the crystalline semiconductor layers 706 to 711 is described below. First, the amorphous semiconductor layer 704 is formed over the insulating layer 703 by a plasma CVD method. Next, after a solution containing nickel, which is a metal element for promoting crystallization, is held over the amorphous semiconductor layer, the crystalline semiconductor layer is formed by performing a process of dehydrogenation (at 500° C. for an hour) and a process of thermal crystallization (at 550° C. for four hours) on the amorphous semiconductor layer. A resist mask is formed over the crystalline semiconductor layer obtained by crystallization of the amorphous semiconductor layer using a first photomask, and then the crystalline semiconductor layer is etched into a desired shape, whereby the crystalline semiconductor layers 706 to 711 can be formed.

In forming the crystalline semiconductor layer by a laser crystallization method, a gas laser or a solid state laser can be used. The gas laser or the solid state layer may be a continuous wave laser or a pulsed laser. As a laser beam which can be used here, for example, a laser beam emitted from one or plural kinds of a gas laser such as an Ar laser, a Kr laser, or an excimer laser; a laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$, to which one or plural kinds of Nd, Yb, Cr, Ti, Ho, Er, Tm, and Ta as a dopant is added; a glass laser; a ruby laser; an alexandrite laser; a Ti:sapphire laser; a copper vapor laser; and a gold vapor laser, can be used. Irradiation with a laser beam of a fundamental wave of such laser beams or a second to fourth harmonic of such a fundamental wave can give a crystal with a large grain size.

Note that laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$, to which one or plural kinds of Nd, Yb, Cr, Ti, Ho, Er, Tm, and Ta as a dopant is added; an Ar ion laser; and a Ti:sapphire laser, can continuously oscillate. Further, pulse oscillation thereof can be performed with a repetition rate of 10 MHz or more by performing Q switch operation or mode locking. When a continuous wave laser or a laser beam oscillated at a repetition rate of 10 MHz or more is irradiated, the surface of the crystallized semiconductor layer can be flattened. In this way, a gate insulating layer to be formed in a later step can be thinned, whereby a thinner-mode semiconductor device can be manufactured. Moreover, the withstand voltage of a gate insulating layer can be improved.

The crystallization of the amorphous semiconductor layer using a metal element for promoting crystallization has the advantages of allowing crystallization at a low temperature in a short time and aligning directions of crystals; on the other hand, the crystallization has a disadvantage that off current is increased due to the metal element remaining in the crystalline semiconductor layer and characteristics of the crystalline semiconductor layer are not stabilized. With that, an amorphous semiconductor layer serving as a gettering site is preferably formed over the crystalline semiconductor layer. Since the amorphous semiconductor layer serving as a gettering site should contain an impurity element such as phosphorus or argon, the amorphous semiconductor layer is preferably formed by a sputtering method by which argon can be contained in the amorphous semiconductor layer at high concentration. Then, a heat treatment (a thermal annealing using an RTA method, an annealing furnace, or the like) is performed to diffuse the metal element into the amorphous semiconductor layer. Subsequently, the amorphous semiconductor layer containing the metal element is removed. As a result, the metal element contained in the crystalline semiconductor layer can be reduced or removed.

Subsequently, the resist mask is removed. After that, the semiconductor layer is doped with a slight amount of an impurity element (boron or phosphorus) in order to control a threshold of the TFT, if necessary. Here, an ion doping method with plasma-excited diborane ($B_2H_6$) without mass separation is employed. Then, it is preferable to remove an oxide film on a surface of the semiconductor film with an etchant containing hydrogen fluoride and to wash the surface of the semiconductor film simultaneously.

Next, a gate insulating layer 705 is formed to cover the crystalline semiconductor layers 706 to 710 (FIG. 3B). The gate insulating layer 705 is formed of a single layer or a stacked layer of a film formed with a material containing an oxide or a nitride of silicon by a CVD method or a sputtering method. The gate insulating layer may be formed by performing a high-density plasma treatment on the crystalline semiconductor layers 706 to 710 and oxidizing or nitriding the surface thereof. For example, the gate insulating layer 705 is formed by a plasma treatment with a mixed gas introduced of a rare gas such as He, Ar, Kr, or Xe and oxygen, nitrogen oxide ($NO_2$), ammonia, nitrogen, hydrogen, or the like. When plasma excitation in this case is performed by introduction of a microwave, high-density plasma can be produced at low electron temperature. The surface of the semiconductor layers can be oxidized or nitrided with an oxygen radical (which may include an OH radical) or a nitrogen radical (which may include an NH radical) that is produced by the high-density plasma.

With a treatment using such high-density plasma, an insulating film with a thickness of 1 to 20 nm, typically, 5 to 10 nm, is formed over the semiconductor films. A reaction in this case is a solid-phase reaction; therefore, the interface state density between the insulating layer and the semiconductor films can be extremely lowered. Since such a high-density plasma treatment directly oxidizes (or nitrides) the semiconductor films (of crystalline silicon or polycrystalline silicon), variation in a thickness of the insulating film to be formed can be ideally suppressed significantly. Furthermore, oxidation is not performed strongly also at a crystal grain boundary of crystalline silicon, which leads to an extremely preferable state. In other words, when each surface of the semiconductor films is subjected to solid-phase oxidation by the high-density plasma treatment shown here, an insulating film with low interface state density and favorable uniformity can be formed without causing abnormal oxidation reaction at a crystal grain boundary. Accordingly, a semiconductor device which is thinner and has better characteristics can be manufactured.

As the gate insulating layer, only an insulating film formed by a high-density plasma treatment may be used. Alternatively, an insulating film of silicon oxide, silicon oxynitride, or silicon nitride may be deposited or stacked thereover by a CVD method utilizing plasma or a thermal reaction. In either case, by forming the gate insulating layer of a transistor to include partially or wholly such an insulating film formed with high-density plasma, variation in characteristics of the transistors can be reduced. Accordingly, a semiconductor device which is thinner and has better characteristics can be manufactured.

In crystallization of the semiconductor film, the crystalline semiconductor layers 706 to 711 obtained by crystallizing the semiconductor film which is irradiated with a continuous wave laser beam or a laser beam oscillated at a repetition rate of 10 MHz or more, with scanning the semiconductor layer with the laser beam in one direction, have a feature that crystals grow in the scanning direction of the laser beam. When transistors are arranged such that the scanning direction is aligned with each a channel length direction (a direction in which carries flow when a channel formation region is formed) and the transistors are combined with the gate insulating layer, the transistors (TFTs) with little variation in characteristics and high electron field-effect mobility can be obtained.

Subsequently, a conductive layer 503 is formed over the gate insulating layer 705 by a plasma CVD method or a sputtering method. After that, a resist mask is formed using a second photomask by a photolithography method and is etched to form a gate electrode and a gate wiring. In this way, gate electrodes 504 to 508 and a first electrode 509 functioning as a lower electrode of the memory elements are formed (FIG. 3C).

A material for the gate electrodes 504 to 508 and an upper layer side of the first electrode 509 are preferably a material being capable of being alloyed with silicon. Specifically, the gate electrodes 504 to 508 and an upper layer side of the first electrode 509 can be formed of a single or stacked layer of an alloy material or a compound material which contains an element as its main component selected from: Ti, W, Ni, Cr, Mo, Ta, Co, Zr, V, Pd, Hf, Pt, Fe. However, more preferable is W or Mo because a high melting point metal is suitable for a gate electrode of a thin film transistor (a TFT). In stacked layers of the gate electrodes 504 to 508 and the first electrode 509, there is no particular limitation on a material layer functioning as a lower layer and it may be a polycrystalline silicon layer doped with an impurity element such as phosphorus if the material layer functioning as the upper layer is formed of the above material.

In the case of forming the second electrode (an upper electrode) in the memory element formed in a later step with the material being capable of being alloyed with silicon, there is no particular limitation on materials of the gate electrodes 504 to 508 and the first electrode 509. For instance, the gate electrodes 504 to 508 and the first electrode 509 can be formed with an element selected from tantalum (Ta), tungsten (W), titanium (Ti), molybdenum (Mo), aluminum (Al), copper (Cu), chromium (Cr), or the like; or an alloy material or a compound material containing the above element as its main component. Alternatively, the electrodes 504 to 508 and the first electrode 509 can be formed with semiconductor materials typified by polycrystalline silicon doped with an impurity element such as phosphorus. As an example of a combination of the first conductive layer and the second conductive layer, a layer formed of tantalum nitride and a layer formed of tungsten, a layer formed of tungsten nitride and a layer formed of tungsten, a layer formed of molybdenum nitride and a layer formed of molybdenum, or the like can be given. Since tungsten and tantalum nitride have high heat resistance, a heat treatment for thermal activation can be performed after forming the first conductive layer and the second conductive layer. In the case of employing a three-layer structure instead of a two-layer structure, a stacked structure of a layer formed of molybdenum, a layer formed of aluminum, and a layer formed of molybdenum may be employed.

Subsequently, a resist mask 510 is formed to cover the crystalline semiconductor layers 707 to 711 functioning as a region of n-channel TFTs using a third photomask. Then, an impurity region imparting p-type is formed by introduction of an impurity element to a semiconductor layer functioning as a region of a p-channel TFT using the gate electrode 504 as a mask (FIG. 3C). As the impurity element imparting p-type, boron (B), aluminum (Al), or gallium (Ga), or the like can be used. Here, with introduction of boron (B) having a concentration of $1 \times 10^{19} \sim 1 \times 10^{20}/cm^3$ to the semiconductor layer functioning as the region of the p-channel TFT, the impurity region imparting p-type can be formed. As a result, source and drain regions 514 and 515, and a channel formation region 516 are formed in the semiconductor layer functioning as the region of the p-channel TFT.

Next, an insulating layer is formed to cover the gate insulating layer 705, the gate electrodes 504 to 508, and the first electrode 509. The insulating layer is formed of a single layer or a stacked layer which is formed of a film formed of a material containing an inorganic material such as silicon, an oxide of silicon, or a nitride of silicon, or a film formed of a material containing an organic material such as an organic resin by a plasma CVD method or a sputtering method.

Next, the insulating layer is selectively etched by anisotropic etching, in which etching is performed mainly in a perpendicular direction, to form the sidewall insulating layers 739 to 748 touching side faces of the gate electrodes 504 to 508, and the sidewall insulating layers 749 and 750 touching side faces of the first electrode 509 (FIG. 3D). Note that the sidewall insulating layers 739 to 750 are curved at faces which do not touch the gate electrodes 504 to 508 or the gate electrode 509. On manufacturing the sidewall insulating layers 739 to 750, the gate insulating layer 705 is etched to form insulating layers 301 to 306. The sidewall insulating layers 739 to 748 are used as masks for doping when LDD (lightly doped drain) regions are formed later.

Then, a resist mask is formed to cover the crystalline semiconductor layer 706 which functions as a region of the p-channel TFT and the crystalline semiconductor layer 709 which is formed below the memory element using a fourth photomask 511. After that, an impurity element is introduced into the crystalline semiconductor layers 707, 708, 710, and 711 which are regions functioning as the n-channel TFTs using the gate electrodes 505 to 508 and the sidewall insulating layers 741 to 744 and 745 to 748 as masks, so that first impurity regions (also referred to as LDD regions) 727, 729, 731, and 733, and second impurity regions 726, 728, 730, and 732 are formed (FIG. 4A). Here, the concentration of the impurity element in the first impurity regions 727, 729, 731, and 733 is lower than that of the second impurity regions 726, 728, 730, and 732. Here, with introduction of phosphorus (P) with a concentration of $1 \times 10^{19}$ to $1 \times 10^{20}/cm^3$ into the semiconductor layers of the regions functioning as the n-channel TFT, a high concentration impurity region imparting n-type can be formed. As a result, the second impurity regions 726, 728, 730, and 732 which function as source and drain regions, the first impurity regions 727, 729, 731, and 733 which function as the LDD regions, and channel formation regions 401 to 404 are formed in the semiconductor layers of the region functioning as the n-channel TFT. Note that the LDD regions are formed below the sidewall insulating layers.

It is to be noted that a structure in which the LDD regions are formed in the semiconductor layers included in the n-channel TFTs, and the LDD regions are not provided to the semiconductor layers included in the p-channel TFTs in this embodiment mode. However, the present invention is not limited to this structure. The LDD regions may be formed in both of the semiconductor layers serving as the n-channel TFTs and the p-channel TFTs, or the LDD regions may be not provided to neither of the semiconductor layers.

Subsequently, the resist mask is removed to form an insulating film 522 over the gate electrodes and the semiconductor layers (FIG. 4B). The insulating film 522 is formed by an SOG method, a droplet discharge method, or the like with a single layer or a stacked layer of an inorganic material such as an oxide of silicon, or a nitride of silicon; an organic material such as polyimide, polyamide, benzocyclobutene, acrylic, epoxy, or siloxane; or the like. Siloxane is a resin containing Si—O—Si bond. Siloxane has a skeleton structure containing a bond of silicon (Si) and oxygen (O). As a substituent, an organic group containing at least hydrogen (for example, an alkyl group, and aromatic hydrocarbon) is used. Further, a fluoro group may be used as a substituent. An activation treatment and a hydrogenation treatment of an impurity element added to the semiconductor layers may be performed after forming the insulating film 522. Thermal treatment (at 300 to 550° C. for 1 to 12 hours) in a furnace or a rapid thermal annealing method (an RTA method) using a lamp light source is used for the activation treatment and hydrogenation treatment of the impurity element. A silicon nitride oxide film (a SiNO film) with a thickness of 50 to 200 nm obtained by a PCVD method can be used for the insulating film 522. Besides, in the case where the semiconductor film is crystallized using a metal element for promoting crystallization, typically nickel, gettering which reduces nickel in the channel formation region can also be performed simultaneously in the activation. Note that the insulating film 522 is the first layer of an interlayer insulating film.

Next, an insulating film 523 which serves as the second layer of the interlayer insulating film is formed by a sputtering method, an LPCVD method, a plasma CVD method, or the like (FIG. 4C). A single layer or a stacked layer of an insulating film such as a silicon oxide film, a silicon nitride film, or a silicon oxynitride film is used for the insulating film 523. Here, the thickness of the insulating film 523 is 300 to 800 nm.

After that, a resist mask is formed over the insulating film 523, using a fifth photomask. The insulating film 522 and the insulating film 523 are selectively etched, so that a first opening 501 exposing a part of the first electrode 509, the sidewall insulating layers 749 and 750, and the crystalline semiconductor layer 709 is formed (FIG. 4D). The resist mask is removed after forming the first opening 501.

Figure 5A:
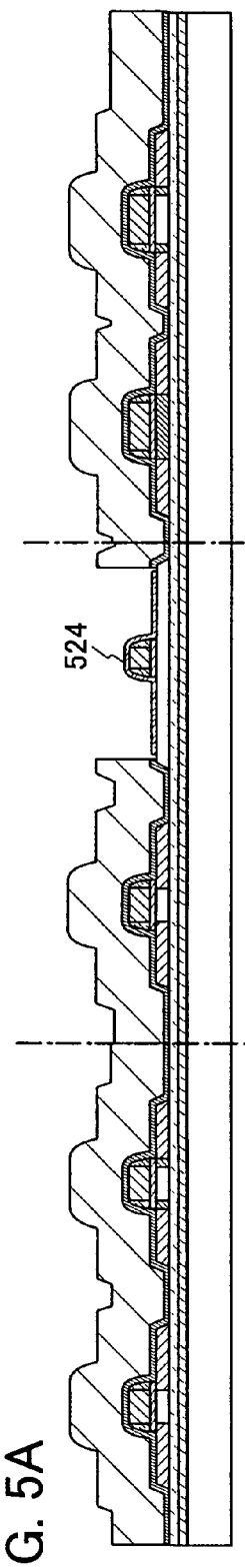
FIGS. 5A to 5C are views showing an example of steps for manufacturing a semiconductor device with the use of a memory element of the present invention.

Next, a silicon film is formed over the first electrode 509, the sidewall insulating layers 749 and 750, and the crystalline semiconductor layer 709 by a sputtering method, a LPCVD method, a plasma CVD method, or the like. The thickness of the silicon film is approximately 10 to 200 nm using any one of an amorphous silicon film, a microcrystalline film, or a polycrystalline silicon film. In this embodiment mode, an amorphous silicon film with a thickness of 100 nm is formed by a plasma CVD method. After that, a resist mask is formed over the amorphous silicon film using a sixth photomask so that the amorphous silicon film is selectively etched to form a silicon film 524 (FIG. 5A). The resist mask is removed after etching. Note that a film formed over the first electrode 509, the sidewall insulating layers 749 and 750, and the crystalline semiconductor layer 709 is not limited to the silicon film as long as a semiconductor layer is formed with a material being capable of being alloyed with either the first electrode 509 or the second electrode 540. For example, it can be used a compound semiconductor formed of GaAs, InP, SiC, ZnSe, GaN, SiGe, or the like, or an oxide semiconductor and the like formed of zinc oxide (ZnO), tin oxide (SnO$_2$), or the like besides a single semiconductor formed of silicon (Si), germanium (ge), or the like.

Figure 5B:
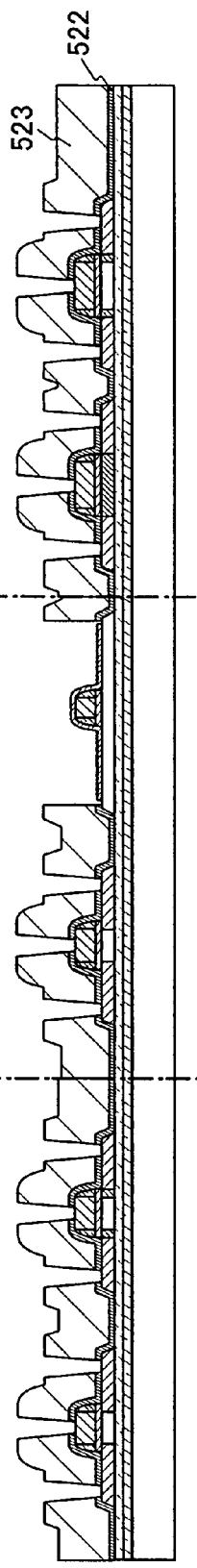

Next, a resist mask is formed over the insulating film 523 using a seventh photomask so that the insulating film 522 and the insulating film 523 are selectively etched to form contact holes reaching the semiconductor layers and contact holes reaching the gate electrodes (FIG. 5B). Then, the resist mask is removed after etching.

Afterwards, when an oxide film on surfaces of the semiconductor layers and surfaces of the gate electrodes which are exposed by an etchant containing hydrogen fluoride is removed, exposed surfaces of the semiconductor layer and the first electrode may be washed simultaneously.

Following this, a conductive film is formed over the insulating film 523 by a sputtering method. By etching in a later step, this conductive film serves as the second electrode 540 in the memory element, wirings of the TFT in the driver circuit portion 601, the TFT in a memory portion 602, and the TFT in an antenna portion and power supply circuit portion 603. The conductive film can be formed of a single layer film or a stacked film of, for example, a metal material formed of an element selected from Ti, W, Ni, Cr, Mo, Ta, Co, Zr, V, Pd, Hf, Pt, Fe, Al, and Cu, an alloy material or a compound material containing the above element as a main component. However, in the case of forming the first electrode 509 serving as the lower electrode of the memory element with a material being capable of being alloyed with the silicon film 524, there is no particular limitation on a material for the conductive film.

Further, in stacking the conductive film, at least one layer touching the silicon film 524 uses a material being capable of being alloyed with silicon. For instance, a three-layer structure of a Ti film, an Al film containing a slight amount of Si, and a Ti film, or a three-layer structure of a Ti film, an Al alloy film containing Ni and C, and a Ti film is employed. In this embodiment mode, a stacked layer of three layers is employed: a Ti film with a thickness of 100 nm, a pure Al film with a thickness of 350 nm, and a Ti film with a thickness of 100 nm.

Figure 5C:
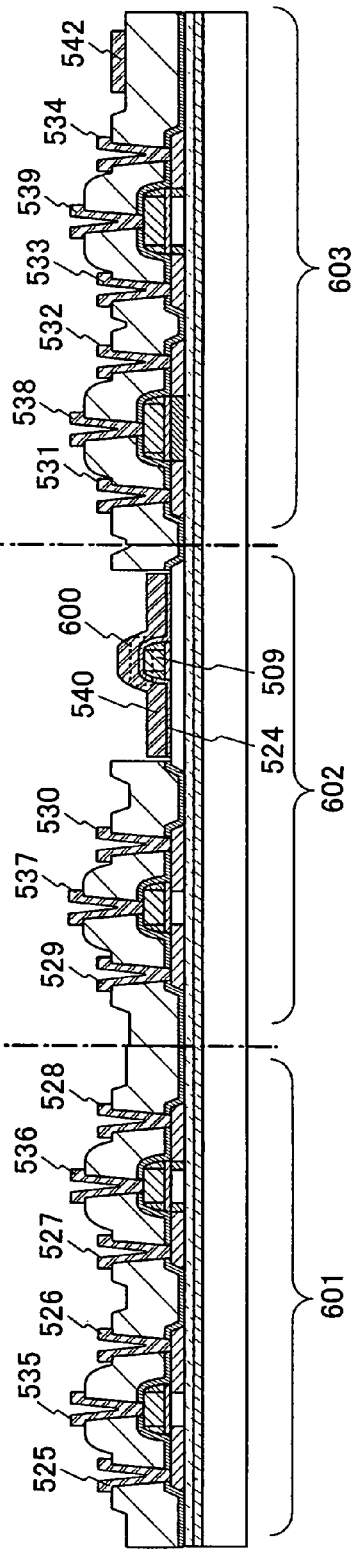

Subsequently, a resist mask is formed over the conductive film using a eighth photomask so that the conductive film is etched to form source and drain electrodes 525 to 534, gate-leading wirings 535 to 539, the second electrode 540 in the memory element, and a connection electrode 542 of the antenna portion (FIG. 5C). The second electrode 540 overlaps the silicon film 524 and functions as an upper electrode of the memory element. Note that the connection electrode 542, although not shown, is electrically connected to a TFT of the antenna portion and power supply circuit portion. Then, the resist mask is removed after etching. In such a manner, the memory element 600 including the silicon film 524 formed over the first electrode 509 and the second electrode 540 formed over the silicon film 524 can be obtained.

Here, the crystalline semiconductor layer 709 is an etching stopper for preventing the silicon film 524 and the second electrode 540 from being etched to base layers in etching. Moreover, in this embodiment mode, the second electrode 540 is formed after the silicon film 524 is etched; however, the silicon film 524 and the second electrode 540 may be formed simultaneously by etching after the silicon film and the conductive layer are sequentially formed. In this manner, it can reduce a sheet of photomask; therefore, the number of steps can be reduced.

Next, an insulating film 543 which covers the TFTs of the driver circuit portion 601, the TFTs and the memory elements of the memory portion 602, and the TFTs of the antenna portion and power supply portion 603 are formed. An insulating film containing silicon oxide or an organic resin film is used for the insulating film 543. The insulating film containing silicon oxide is preferably used for improving reliability of a wireless chip. In addition, an organic resin film formed by a coating method is preferably used because the insulating film 543 desirably has a flat surface in the case of forming an antenna in a later step by a screen printing method. The film used for the insulating film 543 may be appropriately selected by practitioners. Moreover, in this embodiment mode, the example in which the antenna to be formed in a later step overlaps a driver circuit and the memory portion. Thus, the insulating film 543 functions as an interlayer insulating film which isolates the driver circuit from the antenna. In the case where the antenna has a circular shape (for instance, a loop antenna) or a spiral shape, one of the opposite ends of the antenna is led by a wiring of a lower layer; thus, it is preferable to provide the insulating film 543. Note that in the case where a microwave method is employed and the antenna has a linear shape (for instance, a dipole antenna), a flat shape (for instance, a patch antenna), or the like, the antenna to be formed later can be arranged so as not to overlap the driver circuit and the memory portion; thus, the insulating film 543 need not to be provided.

Figure 6A:
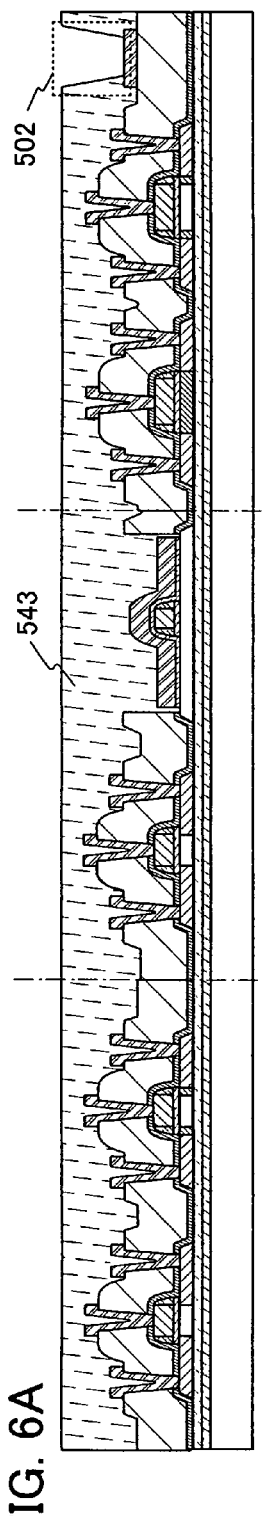
FIGS. 6A to 6C are views showing an example of steps for manufacturing a semiconductor device with the use of a memory element of the present invention.

Next, a resist mask is formed over the insulating film 543 using a ninth photomask. The insulating film 543 is selectively etched, so that a second opening 502 reaching the connection electrode 542 is formed (FIG. 6A). The resist mask is removed after etching.

Figure 6B:
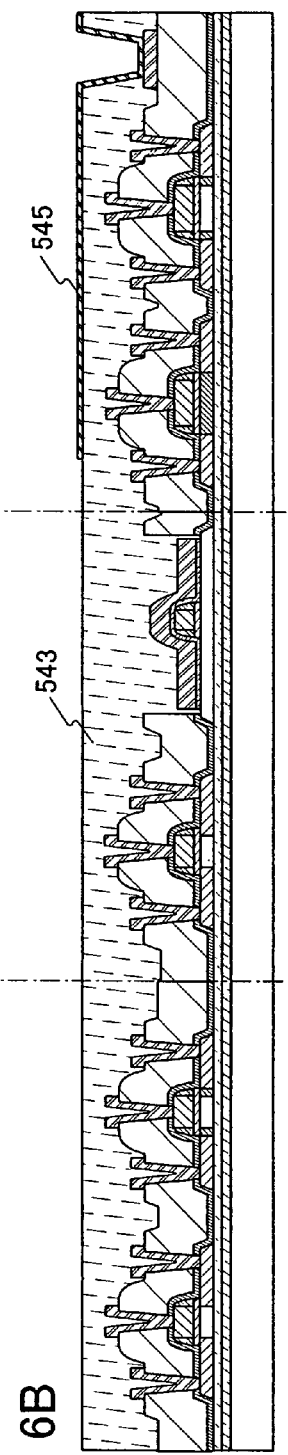
Figure 6C:
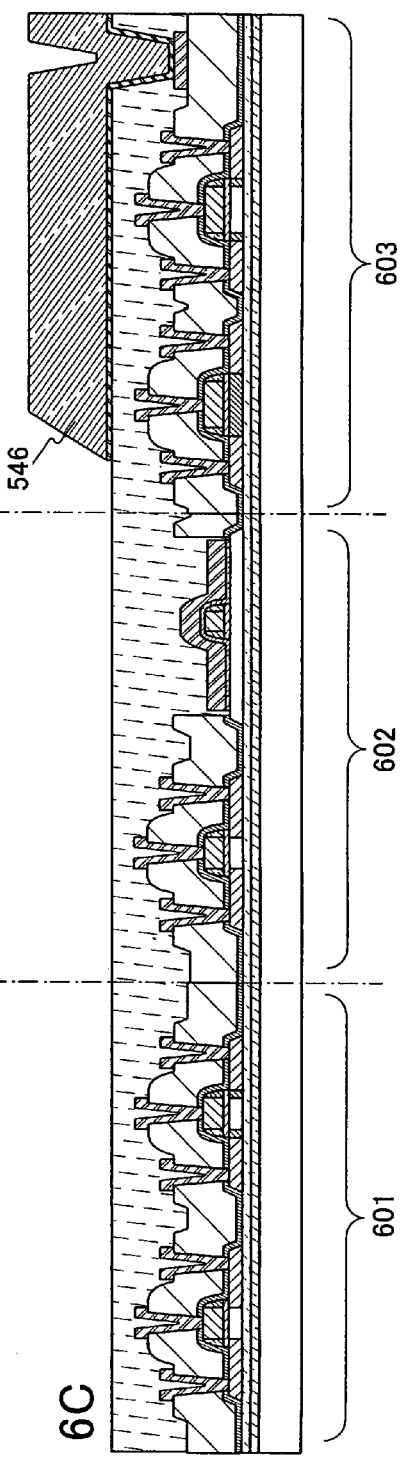

Next, a base film 545 for an antenna is formed over the insulating film 543 (FIG. 6B). A single layer formed of an element selected from Ti, Ni, and Au or a stacked layer thereof is used for a metal film. Then, a resist mask is formed over the metal film using a tenth photomask, and the metal film is selectively etched, so that the base film 545 for the antenna can be formed. Note that, here, the base film 545 for the antenna can be selectively formed by a sputtering method using a metal mask instead of using the resist mask, as well. Though the base film 545 is not necessarily required, with the base film 545 for the antenna, a large contact area with the antenna can be secured.

Next, an antenna 546 is formed over the base film 545. The antenna 546 can be formed in such a manner that a metal film formed of Al, Ag, or the like is formed by a sputtering method, and then etched using a photomask, or the antenna 546 can be formed by a screen printing method. If reduction in the number of photomasks is prioritized, the antenna 546 may be formed by a screen printing method. A screen printing method refers to a method in which an ink or a paste, which is put on a screen plate formed in such a manner that a predetermined pattern is formed by a photosensitive resin on a base made of a metal mesh or a high polymer fiber mesh, is transferred to a work which is placed on the opposite side of the screen plate, with the use of a rubber, plastic, or a metal blade which is called a squeegee. A screen printing method has a merit that pattern formation in a comparatively large area can be realized at low cost.

Through the above steps, the TFT in the driver circuit portion 601, the TFT and the memory element 600 in the memory portion 602, and the TFT and the antenna of the antenna portion and power supply circuit portion 603 can be formed over one substrate.

In this embodiment mode an example of forming the resist mask using a photomask is shown. However, it is not limited to the example and the resist mask may be selectively formed using a resist material instead of a photomask by a droplet discharge method.

Then, an insulating layer 772 is formed to cover the TFTs in the driver circuit portion 601, the TFTs and the memory element 600 in the memory portion 602, and the TFTs and the antenna of the antenna portion and the power supply circuit portion 603 (FIG. 7A). There is no particular limitation on the insulating layer 772, and it is acceptable as long as the insulating layer 772 is formed with a material having a function of preventing element formation layers including TFTs from being damaged in a separation step described later; however, the insulating layer 772 is preferably formed with resin (more preferably, epoxy resin). Using epoxy resin for the insulating layer 772 makes it possible to improve flatness on the surface of the insulating layer 772, reduce damages to the elements formation layers including TFTs in the later separation step, protect the storage element portion and the element formation layers below the insulating layer 772 from dusts and the like, and keep the mechanical strength of the semiconductor device.

It is to be noted that a layer including the thin film transistors 780 to 784 and the memory element 600 is referred to as an element formation layer 791 in this embodiment mode. The thickness of the layers in a position below the conductive layer (excluding the substrate 701) is 5 μm or less, preferably 0.1 to 3 μm. Although not shown here, elements such as a diode, a TFT, a capacitor, and a resistor may be formed in the element formation layer 791.

FIGS. 7A and 7B show a part of a wireless chip and, although not shown here, a number of the wireless ships are formed over the substrate 701. To separate each of the wireless chips, opening portions are formed using a dicer, laser, a wire saw, or the like so as to expose a part of the surface of the separation layer 702. Next, an etching agent is introduced into the opening portions which expose a part of the separation layer to remove the separation layer 702. As the etching agent, a gas or a liquid containing halogen fluoride can be used. For example, chlorine trifluoride ($ClF_3$), nitrogen trifluoride ($NF_3$), bromine trifluoride ($BrF_3$), and hydrogen fluoride (HF) are given. Note that when hydrogen fluoride is used as the etching agent, a layer containing silicon oxide is used for the separation layer 702.

In addition, the insulating layer 772 is provided so that the element formation layer 791 including the thin film transistors 780 to 784 is not stripped after the separation layer 702 is removed. Since each of the wireless chip portions separated at the opening of the element formation layer 791 including the thin film transistors 780 to 784 is small, thin and light, it is easy to be scattered after the separation layer 702 is etched because adhesion to the substrate 701 is reduced. However, with formation of the insulating layer 772 over the element formation layer 791 including the thin film transistors 780 to 784, the weight of the element formation layer 791 including the thin film transistors 780 to 784 is increased, whereby each wireless chip portion divided at the opening portion of the element formation layer 791 is prevented from being scattered from the substrate 701. The element formation layer 791 including the thin film transistors 780 to 784 itself is thin and light; however, forming the insulating layer 772 enables keeping the element formation layer 791 including the thin film transistors 780 to 784 a flat shape. Thus, a certain level of strength thereof can be secured.

Next, the insulating layer 772 is bonded to a sheet material 776 so that the element formation layer 791 including the thin film transistors 780 to 784 is completely separated from the first substrate 701 (FIG. 7B). Here, the sheet material 776 may be a material which has high adhesiveness in a normal state but low adhesiveness when it is applied with heat and irradiated with light. For example, it may be used a heat-peeling tape whose adhesiveness is weakened by heat, a UV-peeling tape whose adhesiveness is weakened by ultraviolet rays, or the like. In addition, a low-viscosity tape having low adhesiveness in a normal state may be used, for example. Note that the first substrate 701 from which the element formation layer 791 including the thin film transistors 780 to 784 is separated may be reused for cost reduction.

Next, the insulating layer 703 is fixed to the substrate 778. Here, the substrate 778 corresponds to a film obtained by stacking an adhesive synthetic resin film (for instance, acrylic synthetic resin or epoxy-based synthetic resin) and any of a film made of polypropylene, polyester, vinyl, polyvinyl fluoride, vinyl chloride, or the like; paper made of a fibrous material; and a base film (for instance, polyester, polyamide, inorganic deposited film, or paper). In the case of using plastic for the substrate 778, it is thin, light, and bendable, which leads to the use for devices having various designs and easy processing into a flexible shape. Such a device has a high-impact resistance, and is easy to be attached or embedded into various goods, which allows application to wide variety of fields.

In this embodiment mode, an adhesive layer is provided for the surface of the substrate 778, on the insulating layer 703 side. The adhesive layer corresponds to a layer including an adhesive such as a heat curing resin, an ultraviolet curing resin, a vinyl acetate resin-based adhesive, a vinyl copolymer resin-based adhesive, an epoxy resin-based adhesive, an urethane resin-based adhesive, a rubber-based adhesive, or an acrylic resin-based adhesive.

Note that the surface of the substrate 778 may be coated with silicon dioxide (silica) powder. The coating allows the surface to be kept water-resistant even in an environment of high temperature and high humidity. Moreover, the surface may be coated with a conductive material such as indium tin oxide, so that the material coating the surface charges static electricity, thereby protecting a thin film integrated circuit from static electricity. The surface may also be coated with a material containing carbon as its main component (such as diamond like carbon). The coating increases the strength and can prevent the degradation or destruction of a semiconductor device.

Figure 8:
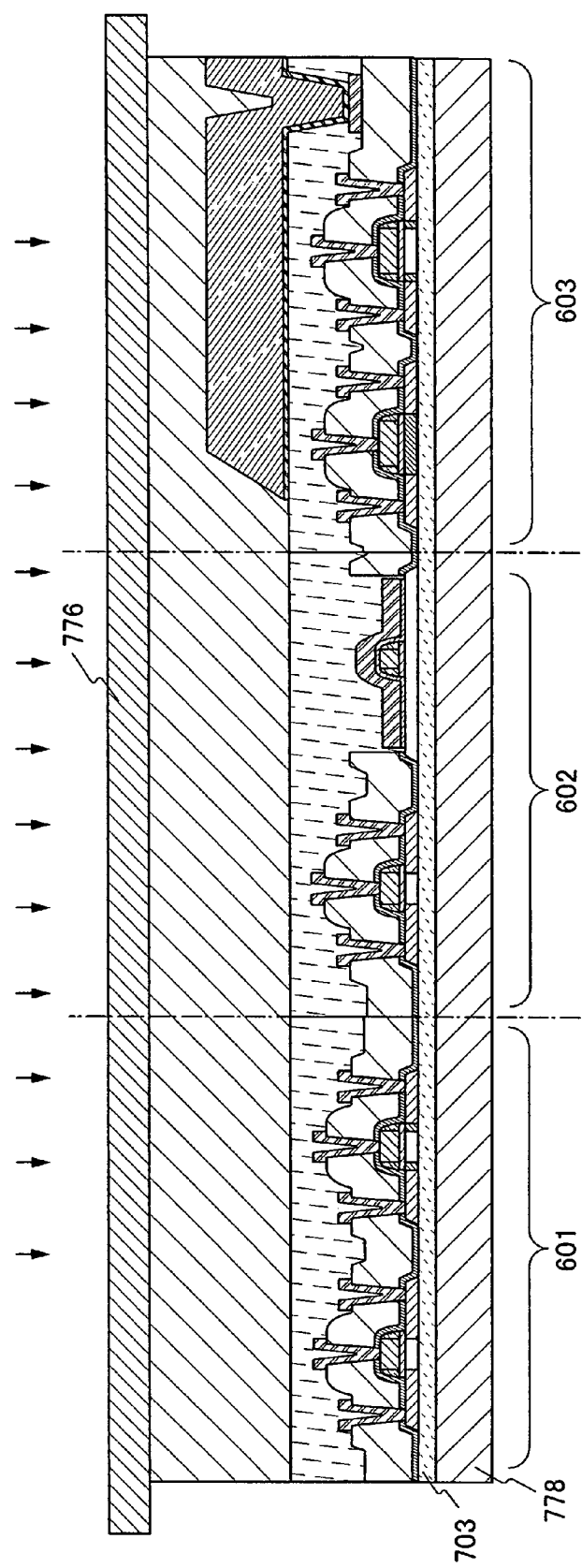
FIG. 8 is a view showing an example of a step for manufacturing a semiconductor device with the use of a memory element of the present invention.

Next, the substrate 778 provided with the element formation layer 791 including the thin film transistors 780 to 784 and the sheet material 776 are separated from each other. Here, a case where a UV-peeling tape is used as the sheet material 776 is described. First, the sheet material 776 is irradiated with ultraviolet rays to weaken the adhesiveness between the sheet material 776 and the insulating layer 772 (FIG. 8). Then, the sheet material 776 is separated from the insulating layer 772.

Through the above steps, the semiconductor device shown in FIG. 2B can be manufactured.

Next, the wireless chip is fixed to a sheet-like substrate. For the sheet-like substrate, plastic, paper, a prepreg, a ceramic sheet, or the like can be used. The wireless chip may be fixed so as to be interposed between two sheet-like substrates, or the wireless chip may be fixed to one sheet-like substance with the adhesive layer. For the adhesive layer, various curable adhesives such as a photo curable adhesive such as a reactive curable adhesive, a thermosetting adhesive, or an ultraviolet curable adhesive; or an aerobic adhesive can be used. Alternatively, the wireless chip can be arranged in the middle of making paper, thereby being provided inside one piece of paper.

With the wireless chip manufactured through the above-described steps, writable memory to which data can be written anytime after manufacture of the wireless chip can be realized. For example, after a wireless chip fixed to a flexible sheet-like substrate is attached to an article with a curved surface, data can be written to an antifuse ROM included in the wireless chip.

The semiconductor device shown in this embodiment mode is provided with the sidewall insulating layer on the side surface of the first electrode in the memory element portion, so that the first electrode does not directly touch the silicon film at the step portion formed by the substrate and the first electrode. Accordingly, in case of forming the silicon film and the second electrode at the step portion formed by the substrate and the first electrode, the first electrode and the silicon film does not touch each other at the step portion. Thus, only the upper portion of the first electrode serves as the memory element. The thickness of the silicon film formed over the upper surface of the first electrode is uniform, whereby variation in writing property of the memory element can be reduced.

Moreover, forming the gate electrode of the transistor and the first electrode of the memory element in the same step makes it possible to form simultaneously the sidewall insulating layer formed on the side surface of the gate electrode and the sidewall insulating layer formed on the side surface of the first electrode. Accordingly, without increasing the number of manufacturing steps, it is possible to manufacture a semiconductor device with a stable writing property of the memory element. Further, the semiconductor device can be miniaturized because variation in writing property can be reduced even if the memory elements are manufactured at the intersections of the wirings functioning as word and bit lines.

(Embodiment Mode 3)

Figure 9:
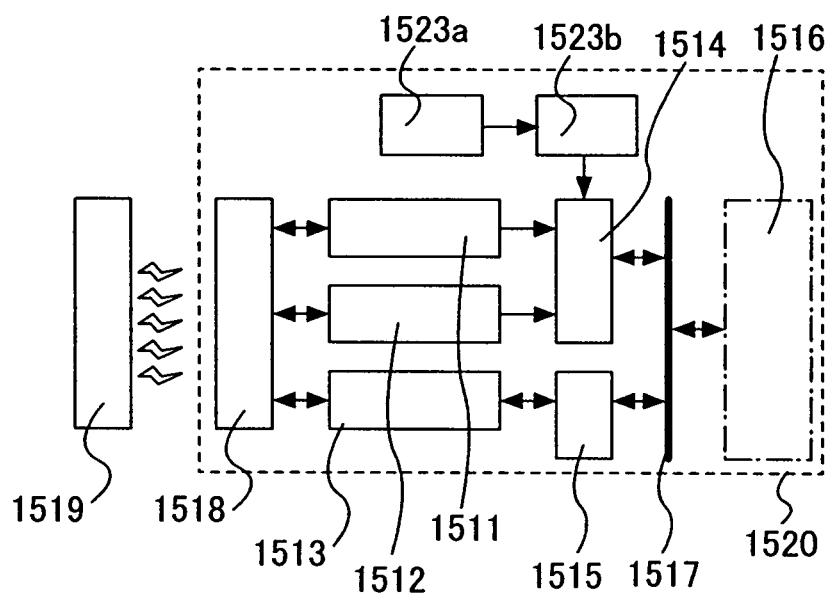
FIG. 9 is a view showing a block diagram of a semiconductor device with the use of a memory element of the present invention.

A structural example of the semiconductor device employing the present invention will be described with reference to FIG. 9. As shown in FIG. 9, a semiconductor device 1520 of the present invention has a function of performing non-contact data communication. The semiconductor device 1520 includes a power supply circuit 1511, a clock generation circuit 1512, a data demodulation/modulation circuit 1513, a control circuit 1514 which controls other circuits, an interface circuit 1515, a memory circuit 1516, a data bus 1517, an antenna 1518, a sensor 1523a, and a sensor circuit 1523b. In FIG. 9, a driver circuit refers to the power supply circuit 1511, the clock generation circuit 1512, the data demodulation/modulation circuit 1513, the control circuit 1514 which controls other circuits, and the interface circuit 1515.

The power supply circuit 1511 is a circuit which generates various power supply to be supplied to each circuit in the semiconductor device 1520, based on an AC signal inputted from the antenna 1518. The clock generation circuit 1512 is a circuit which generates various clock signals to be supplied to each circuit in the semiconductor device 1520, based on the AC signal inputted from the antenna 1518. The data demodulation/modulation circuit 1513 has a function of demodulating/modulating data communicated with a reader/writer 1519. The control circuit 1514 has a function of controlling the memory circuit 1516. The antenna 1518 has a function of transmitting/receiving electric waves. The reader/writer 1519 performs communication with the semiconductor device, control of the communication, and control of processing of the communicated data. Note that the structure of the semiconductor device is not limited to the above-described structure. For example, the semiconductor device may have a structure to which other components such as a limiter circuit of power supply voltage or hardware only for processing codes are added.

The memory circuit 1516 includes a memory portion as described in Embodiment Mode 1, that is, a plurality of memory elements in each of which a silicon film being capable of being alloyed by external electrical action is interposed between the first electrode with the sidewall insulating layer formed on the side of the first electrode and the second electrode. Note that the memory circuit 1516 may include only the memory element in which the silicon film is interposed between the first electrode with the sidewall insulating layer formed on the side of the first electrode and the second electrode, or include a memory circuit with other structure. The memory circuit with other structure corresponds to, for example, one or a plurality of memory selected from DRAM, SRAM, FeRAM, mask ROM, PROM, EPROM, EEPROM, and flash memory.

The sensor 1523a is formed of semiconductor elements such as a resistance element, a capacitive coupling element, an inductive coupling element, a photovoltaic element, a photoelectric conversion element, a thermo-electromotive force element, a transistor, a thermistor, and a diode. The sensor circuit 1523b detects changes in impedance, reactance, inductance, voltage, or current, and performs analog/digital conversion (A/D conversion) to output a signal to the control circuit 1514.

(Embodiment Mode 4)

Figure 10A:
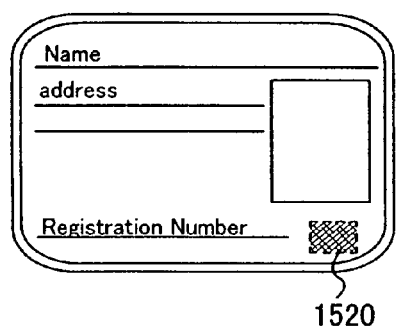
FIGS. 10A to 10F are views showing examples of electronic devices.
Figure 10B:
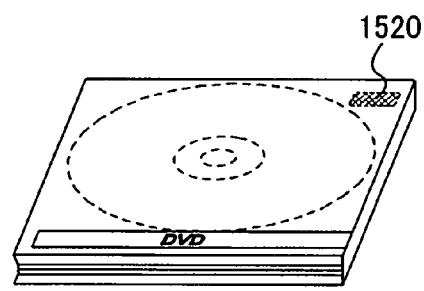
Figure 10C:
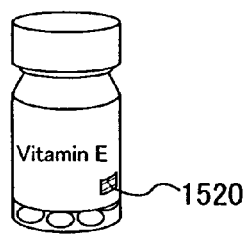
Figure 10D:
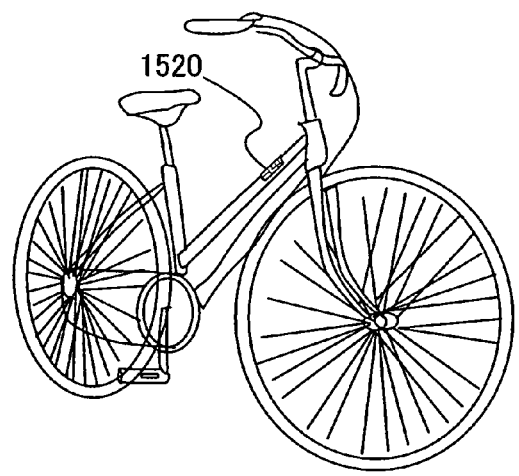
Figure 10E:
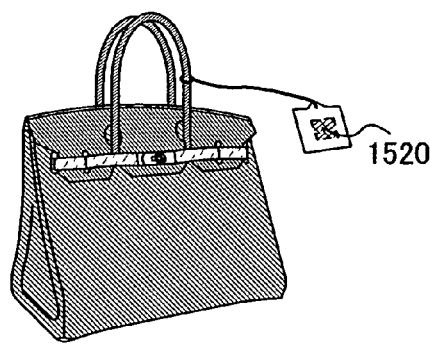
Figure 10F:
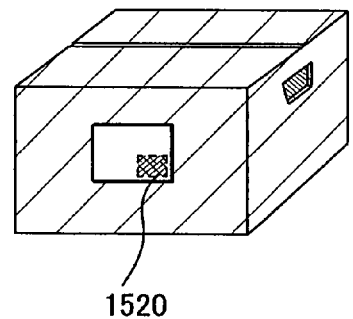

According to the present invention, a semiconductor device 1520 functioning as a wireless chip can be formed. The wireless chip is applicable in a wide range. For example, the wireless chip can be applied to bills, coins, securities, bearer bonds, identification certificates (driver's licenses, certificates of residence, and the like, FIG. 10A), containers for package (package paper, bottles, and the like, FIG. 10C), recording media (DVD software, video tapes, and the like, FIG. 10B), vehicles (bicycles and the like, FIG. 10D), personal belongings (bags, glasses, and the like), foods, plants, animals, clothes, commodities, tags for packages or articles such as electronic devices (FIGS. 10E and 10F), and the like. The electronic devices refer to a liquid crystal display device, an EL display device, a television device (also simply referred to as a TV, a TV receiver machine, or a television receiver machine), a cellular phone, and the like.

The semiconductor device 1520 of the present invention is fixed to a product by being mounted on a printed substrate, attached to a surface of the product, or embedded inside the product. For example, if the product is a book, the semiconductor device 1520 is embedded to the book by being embedded inside a sheet of paper, and if the product is a package made of an organic resin, the semiconductor device 1520 is embedded to the package by being embedded inside the organic resin. Since the semiconductor device 1520 of the present invention can be miniaturized, thin, and lightweight, the design quality of the product itself is not degraded even after the device is fixed to the product. When the semiconductor device 1520 is provided to bills, coins, securities, bearer bonds, identification certificates, or the like, a certification function can be provided and the forgery can be prevented with the utilization of the certification function. Moreover, when the semiconductor device of the present invention is provided in containers for package, recording media, personal belongings, foods, clothes, commodities, electronic devices, and the like, efficiency of systems such as an inspection system can be improved.

Figure 11:
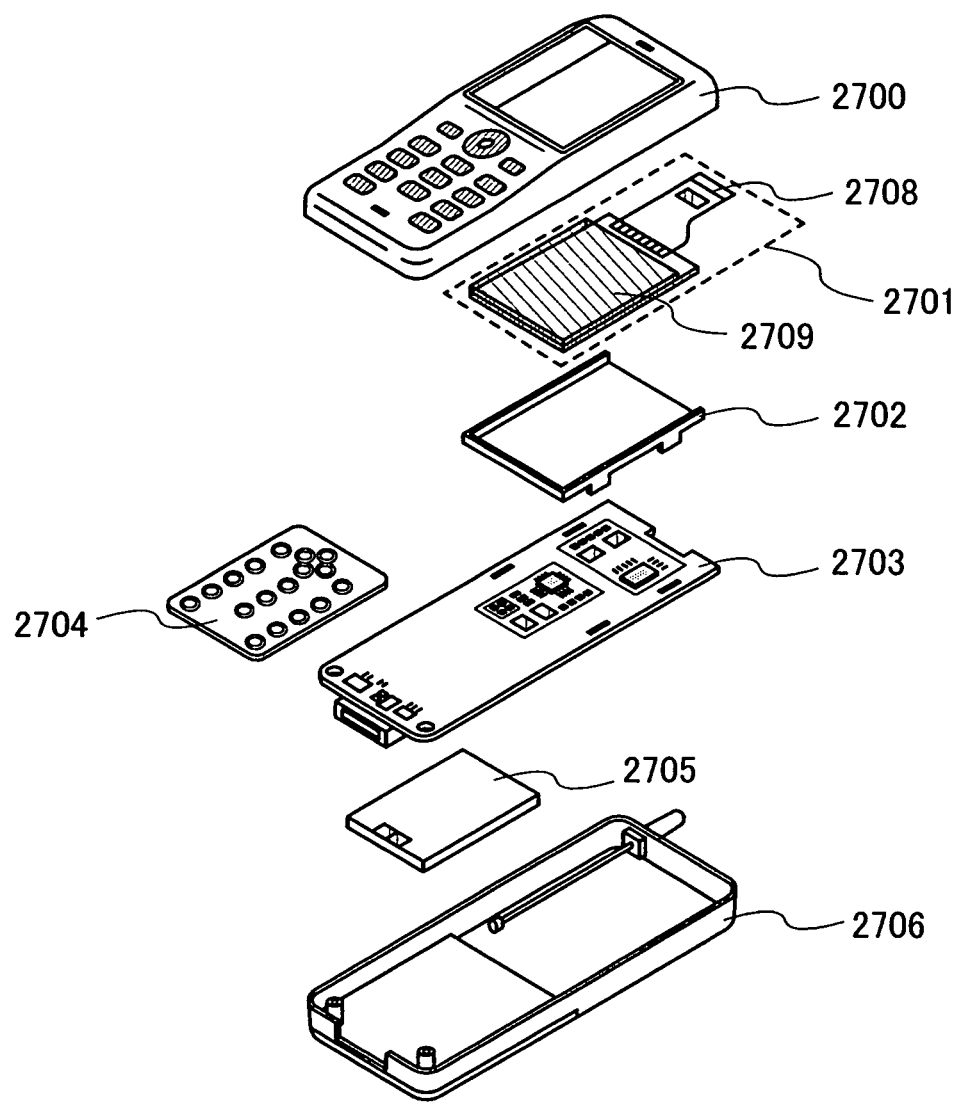
FIG. 11 is a view showing an example of an electronic device.
Figure 12A:
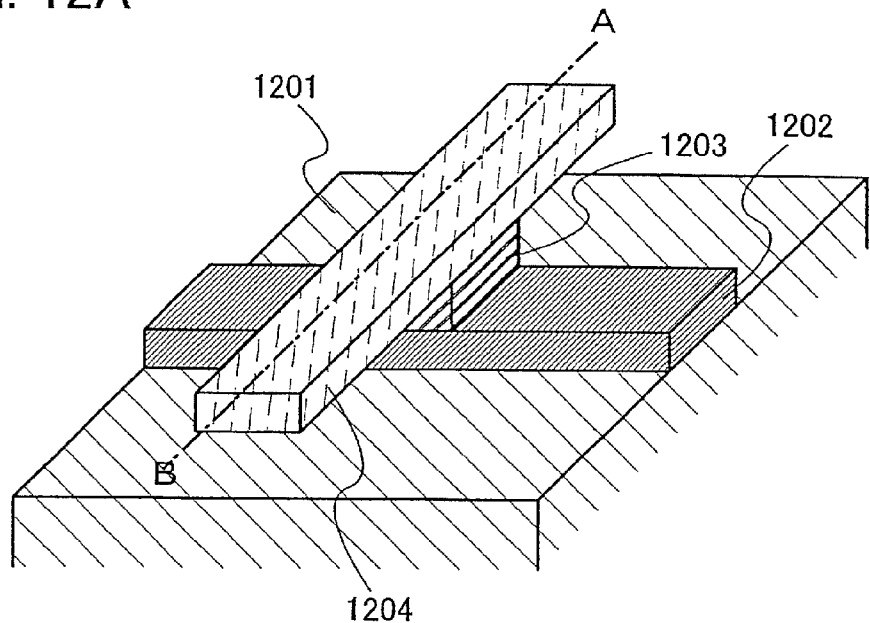
FIGS. 12A and 12B are views showing a cross section of a conventional memory element.
Figure 12B:
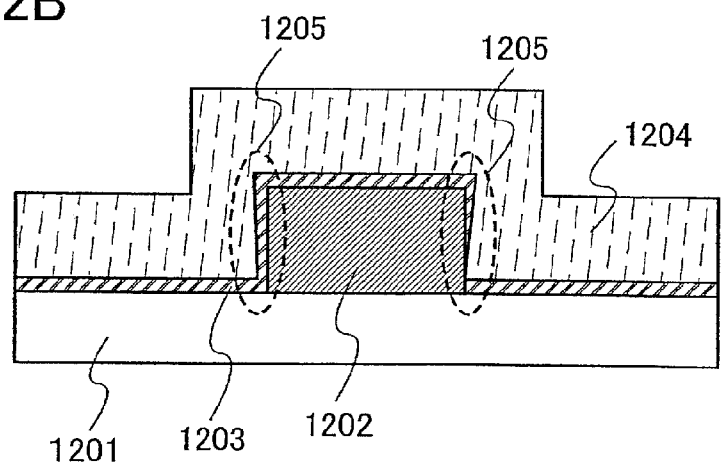

Next, an aspect of an electronic device on which the semiconductor device of the present invention is mounted is described with reference to the drawing. An electronic device shown here is a cellular phone including chassis 2700 and 2706, a panel 2701, a housing 2702, a printed wiring board 2703, operation buttons 2704, and a battery 2705 (FIG. 11). The panel 2701 is detachably incorporated into the housing 2702 and the housing 2702 is fitted into the printed wiring board 2703. The shape and size of the housing 2702 are appropriately modified in accordance with an electronic device into which the panel 2701 is incorporated. The printed wiring board 2703 has a plurality of packaged semiconductor devices mounted thereon. The plurality of semiconductor devices mounted on the printed wiring board 2703 has any function of a controller, a central processing unit (CPU), memory, a power supply circuit, an audio processing circuit, a transmitting/receiving circuit, and the like. The semiconductor device of the present invention can be used for memory among the above.

The panel 2701 is attached to the printed wiring board 2703 through a connection film 2708. The panel 2701, the housing 2702, and the printed wiring board 2703 are placed inside the chassis 2700 and 2706 together with the operation buttons 2704 and the battery 2705. A pixel region 2709 in the panel 2701 is placed so as to be viewable from an opening window provided in the chassis 2700.

As described above, the semiconductor device of the present invention has advantages of its miniaturization, thinness, and lightness in weight. These advantages allow efficient usage of the limited space in the chassis 2700 and 2706 of the electronic device.

The semiconductor device of the present invention includes a memory element with a simple structure in which a silicon film being capable of being alloyed by external electrical action is interposed between a pair of conductive layers; thus, an inexpensive electronic device using a semiconductor device can be provided. The semiconductor device of the present invention has a stable writing property. Therefore, an electronic device with high reliability can be provided. In addition, miniaturizing and high integration are easily realized with the semiconductor device of the present invention because the semiconductor device of the present invention can reduce variation in writing property even if the memory element is manufactured at an intersection of word lines and bit lines. In this way, an electronic device using a semiconductor device including a high-capacity memory circuit can be provided.

Moreover, a memory device included in the semiconductor device of the present invention, which writes data by external electrical action, has characteristics of being nonvolatile and capable of adding data while erasing data is impossible. According to the above-described characteristics, forgery by rewriting can be prevented, and new data can be additionally written. Accordingly, an electronic device which uses a highly functional and highly value-added semiconductor device can be provided.

Note that the shapes of the chassis 2700 and 2706 are examples of an exterior shape of the cellular phone. The electronic device of this embodiment can be modified into various modes in accordance with functions or applications thereof.

This application is based on Japanese Patent Application serial no. 2006-310883 filed in Japan Patent Office on Nov. 17, in 2006, the entire contents of which are hereby incorporated by reference.

What is claimed is:

1. A semiconductor device comprising:
 a first semiconductor layer over an insulating surface;
 a second semiconductor layer over the insulating surface;
 a gate electrode over the first semiconductor layer with a first insulating layer interposed therebetween;
 a first electrode over the second semiconductor layer with a second insulating layer interposed therebetween, the first electrode being provided in the same layer as the gate electrode;
 a sidewall insulating layer on a side surface of the first electrode, wherein the sidewall insulating layer is provided over and in contact with the insulating surface, and wherein the sidewall insulating layer has an inner side surface which contacts the side surface of the first electrode and an outer side surface opposite to the inner side surface;
 a source electrode and a drain electrode over and in contact with the first semiconductor layer;
 a third semiconductor layer over the first electrode and the sidewall insulating layer, wherein the third semiconductor layer is provided over and in contact with the insulating surface, and wherein the third semiconductor layer is provided in contact with the outer side surface of the sidewall insulating layer so that the sidewall insulating layer is interposed between the first electrode and the third semiconductor layer; and
 a second electrode over the first electrode with the third semiconductor layer interposed therebetween,
 wherein the third semiconductor layer crosses the first electrode,
 wherein a material of the first electrode is the same as a material of the gate electrode;
 wherein a material of the second electrode is the same as a material of the source electrode and the drain electrode,
 wherein the first electrode, the sidewall insulating layer, the third semiconductor layer, and the second electrode are included in a memory element, and
 wherein the memory element is capable of changing its state from a first state to a second state upon an application of a voltage, where a resistance between the first electrode and the second electrode is higher in the first state than in the second state.

2. The semiconductor device according to claim 1, wherein at least one of the first electrode and the second electrode comprises a material being capable of being alloyed with the third semiconductor layer.

3. The semiconductor device according to claim 1, wherein the sidewall insulating layer has a curved surface, and
 wherein the sidewall insulating layer is in contact with the third semiconductor layer at the curved surface.

4. The semiconductor device according to claim 1, wherein at least one of the first electrode and the second electrode comprises a material including at least one of elements selected from Ti, W, Ni, Cr, Mo, Ta, Co, Zr, V, Pd, Hf, Pt, and Fe.

5. The semiconductor device according to claim 1, further comprising a substrate with the insulating surface,
 wherein the substrate with the insulating surface is a glass substrate, a plastic substrate, a semiconductor substrate, or a sheet of paper.

6. A semiconductor device comprising:
 a transistor including a gate electrode, a source electrode, and a drain electrode; and
 a memory element including:
 a first electrode over and in contact with an insulating surface;
 a sidewall insulating layer over and in contact with the insulating surface, wherein the sidewall insulating layer has a cross-sectional shape comprising a first layer and a second layer with the first electrode interposed therebetween, and wherein each of the first layer and the second layer has an inner side surface which contacts a side surface of the first electrode and an outer side surface opposite to the inner side surface;

a semiconductor layer over the first electrode and the sidewall insulating layer, wherein the semiconductor layer is provided in contact with the outer side surface of the first layer and the outer side surface of the second layer so that the sidewall insulating layer is interposed between the first electrode and the semiconductor layer; and a second electrode over the first electrode with the semiconductor layer and the sidewall insulating layer interposed therebetween, wherein the gate electrode comprises the same material as the first electrode, wherein the gate electrode is provided in the same layer as the first electrode, wherein at least one of the source electrode and the drain electrode comprises the same material as the second electrode, and wherein at least one of the first electrode and the second electrode comprises a material being capable of being alloyed with the semiconductor layer.

7. The semiconductor device according to claim 6,
wherein the sidewall insulating layer has a curved surface, and
wherein the sidewall insulating layer is in contact with the semiconductor layer at the curved surface.

8. The semiconductor device according to claim 6,
wherein at least one of the first electrode and the second electrode comprises a material including at least one of elements selected from Ti, W, Ni, Cr, Mo, Ta, Co, Zr, V, Pd, Hf, Pt, and Fe.

9. The semiconductor device according to claim 6, further comprising a substrate with the insulating surface.

10. The semiconductor device according to claim 6, further comprising:
a connection electrode electrically connected to the transistor; and
an antenna electrically connected to the connection electrode;
wherein the connection electrode comprises the same material as at least one of the second electrode, the source electrode and the drain electrode.

11. A semiconductor device comprising:
a transistor including a gate electrode, a source electrode, and a drain electrode; and
a memory element including:
a first electrode over and in contact with an insulating surface;
a sidewall insulating layer on a side surface of the first electrode, wherein the sidewall insulating layer is provided over and in contact with the insulating surface, and wherein the sidewall insulating layer has an inner side surface which contacts the side surface of the first electrode and an outer side surface opposite to the inner side surface;
a semiconductor layer over the first electrode and the sidewall insulating layer, wherein the semiconductor layer is provided in contact with the outer side surface of the sidewall insulating layer so that the sidewall insulating layer is interposed between the first electrode and the semiconductor layer; and
a second electrode over the first electrode with the semiconductor layer and the sidewall insulating layer interposed therebetween;

wherein the semiconductor layer crosses the first electrode, wherein the gate electrode comprises the same material as the first electrode, wherein the gate electrode is provided in the same layer as the first electrode, wherein at least one of the source electrode and the drain electrode comprises the same material as the second electrode, and wherein at least one of the first electrode and the second electrode comprises a material being capable of being alloyed with the semiconductor layer.

12. The semiconductor device according to claim 1,
wherein the sidewall insulating layer has a curved surface, and
wherein the sidewall insulating layer is in contact with the semiconductor layer at the curved surface.

13. The semiconductor device according to claim 1,
wherein at least one of the first electrode and the second electrode comprises a material including at least one of elements selected from Ti, W, Ni, Cr, Mo, Ta, Co, Zr, V, Pd, Hf, Pt, and Fe.

14. The semiconductor device according to claim 1, further comprising a substrate with the insulating surface.

15. The semiconductor device according to claim 1, further comprising:
a connection electrode electrically connected to the transistor; and
an antenna electrically connected to the connection electrode;
wherein the connection electrode comprises the same material as at least one of the second electrode, the source electrode and the drain electrode.

16. The semiconductor device according to claim 9,
wherein the substrate with the insulating surface is a glass substrate, a plastic substrate, a semiconductor substrate, or a sheet of paper.

17. The semiconductor device according to claim 14,
wherein the substrate with the insulating surface is a glass substrate, a plastic substrate, a semiconductor substrate, or a sheet of paper.

18. The semiconductor device according to claim 6,
wherein the semiconductor layer comprises an oxide semiconductor.

19. The semiconductor device according to claim 11,
wherein the semiconductor layer comprises an oxide semiconductor.

20. The semiconductor device according to claim 6,
wherein the first electrode is a single layer, and
wherein the semiconductor layer is on and in contact with a top surface of the first electrode.

21. The semiconductor device according to claim 11,
wherein the first electrode is a single layer, and
wherein the semiconductor layer is on and in contact with a top surface of the first electrode.

22. The semiconductor device according to claim 6,
wherein the semiconductor layer is in contact with the first electrode at an intersection of the first electrode and the second electrode.

23. The semiconductor device according to claim 11,
wherein the semiconductor layer is in contact with the first electrode at an intersection of the first electrode and the second electrode.

24. The semiconductor device according to claim 6,
wherein the second electrode is a single layer.

25. The semiconductor device according to claim 11, wherein the second electrode is a single layer.

26. The semiconductor device according to claim 6, wherein the memory element is capable of changing its state from a first state to a second state upon an application of a voltage, and
where a resistance between the first electrode and the second electrode is higher in the first state than in the second state.

27. The semiconductor device according to claim 11, wherein the memory element is capable of changing its state from a first state to a second state upon an application of a voltage, and
where a resistance between the first electrode and the second electrode is higher in the first state than in the second state.

28. The semiconductor device according to claim 6, further comprising a plurality of transistors and a plurality of memory elements,
wherein each of the plurality of transistors is the transistor, and
wherein each of the plurality of memory elements is the memory element.

29. The semiconductor device according to claim 11, further comprising a plurality of transistors and a plurality of memory elements,
wherein each of the plurality of transistors is the transistor, and
wherein each of the plurality of memory elements is the memory element.

30. A semiconductor device comprising:
a first semiconductor layer over an insulating surface;
a second semiconductor layer over the insulating surface;
a gate electrode over the first semiconductor layer with a first insulating layer interposed therebetween;
a first electrode over the second semiconductor layer with a second insulating layer interposed therebetween, the first electrode being provided in the same layer as the gate electrode;
a first sidewall insulating layer on a side surface of the gate electrode;
a second sidewall insulating layer on a side surface of the first electrode, wherein a material of the second sidewall insulating layer is the same as a material of the first sidewall insulating layer;
a source electrode and a drain electrode over and in contact with the first semiconductor layer;
a third semiconductor layer in contact with the first electrode and the second sidewall insulating layer;
a second electrode over and in contact with the third semiconductor layer,
wherein a material of the first electrode is the same as a material of the gate electrode;
wherein a material of the second electrode is the same as a material of the source electrode and the drain electrode,
wherein at least one of the first electrode and the second electrode comprises a material being capable of being alloyed with the third semiconductor layer.

31. The semiconductor device according to claim 30, wherein the third semiconductor layer comprises an oxide semiconductor.

32. The semiconductor device according to claim 30, wherein the second electrode is provided in the same layer as the source electrode and the drain electrode.

33. The semiconductor device according to claim 1, wherein the second electrode is provided in the same layer as the source electrode and the drain electrode.

34. The semiconductor device according to claim 6, wherein the second electrode is provided in the same layer as the source electrode and the drain electrode.

35. The semiconductor device according to claim 11, wherein the second electrode is provided in the same layer as the source electrode and the drain electrode.

36. The semiconductor device according to claim 1, further comprising:
a connection electrode provided in the same layer as the second electrode; and
an antenna electrically connected to the connection electrode.

37. The semiconductor device according to claim 10, wherein the connection electrode is provided in the same layer as the second electrode.

* * * * *

UNITED STATES PATENT AND TRADEMARK OFFICE
CERTIFICATE OF CORRECTION

| | |
|---|---|
| PATENT NO. | : 8,759,946 B2 |
| APPLICATION NO. | : 11/979992 |
| DATED | : June 24, 2014 |
| INVENTOR(S) | : Hajime Tokunaga |

It is certified that error appears in the above-identified patent and that said Letters Patent is hereby corrected as shown below:

In the Claims:

In claim 12, at column 24, line 15, "1," should be --11,--;

In claim 13, at column 24, line 20, "1," should be --11,--;

In claim 14, at column 24, line 25, "1," should be --11,--;

In claim 15, at column 24, line 27, "1," should be --11,--.

Signed and Sealed this
Twentieth Day of January, 2015

Michelle K. Lee
*Deputy Director of the United States Patent and Trademark Office*